United States Patent
Hong et al.

(10) Patent No.: US 12,273,192 B2
(45) Date of Patent: Apr. 8, 2025

(54) METHODS AND PROCEDURES FOR POLAR CODED MODULATION

(71) Applicant: INTERDIGITAL PATENT HOLDINGS, INC., Wilmington, DE (US)

(72) Inventors: Sungkwon Hong, Seoul (KR); Onur Sahin, London (GB)

(73) Assignee: InterDigital Patent Holdings, Inc., Wilmington, DE (US)

(*) Notice: Subject to any disclaimer, the term of this patent is extended or adjusted under 35 U.S.C. 154(b) by 367 days.

(21) Appl. No.: 17/642,286

(22) PCT Filed: Sep. 14, 2020

(86) PCT No.: PCT/US2020/050716
§ 371 (c)(1),
(2) Date: Mar. 11, 2022

(87) PCT Pub. No.: WO2021/051076
PCT Pub. Date: Mar. 18, 2021

(65) Prior Publication Data
US 2022/0345242 A1 Oct. 27, 2022

Related U.S. Application Data
(60) Provisional application No. 62/900,173, filed on Sep. 13, 2019.

(51) Int. Cl.
*H04L 1/00* (2006.01)
(52) U.S. Cl.
CPC .......... *H04L 1/0043* (2013.01); *H04L 1/0003* (2013.01); *H04L 1/0009* (2013.01); *H04L 1/007* (2013.01); *H04L 1/0076* (2013.01)

(58) Field of Classification Search
CPC ... H04L 1/0043; H04L 1/0003; H04L 1/0009; H04L 1/007; H04L 1/0076
See application file for complete search history.

(56) References Cited

U.S. PATENT DOCUMENTS 9,648,601 B2   5/2017  Wang et al.
2017/0366199 A1* 12/2017 Ge ..................... H03M 13/09
(Continued)

FOREIGN PATENT DOCUMENTS

WO   2018/144683   8/2018
WO   2018/192640   10/2018

OTHER PUBLICATIONS

Arikan, "Channel Polarization: A Method for Constructing Capacity-Achieving Codes for Symmetric Binary-Input Memoryless Channels," IEEE Transactions on Information Theory, vol. 55, No. 7, pp. 3051-3073 (Jul. 2009).
(Continued)

*Primary Examiner* — Blake J Rubin
(74) *Attorney, Agent, or Firm* — Volpe Koenig

(57) ABSTRACT

Methods, apparatuses and systems are provided for constructing and modulating polar codes. Such procedures may involve identifying nonuniform channel conditions, selecting a modulation order, configuring a plurality of component codes and incremental ratios for Unequal Error Protection (UEP), identifying initial code construction parameters for each component code, calculating modified code construction parameters based on the incremental ratios for UEP, and encoding the component polar codes according to the modified construction parameters. Each component code may be comprised of a plurality of input bits. The initial and modified code construction parameters may include a number of unfrozen and frozen input bits, and identifying a number of unfrozen and frozen input bits may involve calculating and comparing reliability values for each bit.
(Continued)

Calculating and comparing reliability values for each bit may involve applying a Polarization Weight (PW)-based method.

19 Claims, 12 Drawing Sheets

(56) References Cited

U.S. PATENT DOCUMENTS

| | | | | |
|---|---|---|---|---|
| 2019/0140663 | A1* | 5/2019 | Noh | H04L 1/007 |
| 2019/0181983 | A1 | 6/2019 | Ye et al. | |
| 2019/0238268 | A1* | 8/2019 | Kim | H04L 1/0009 |
| 2019/0245560 | A1 | 8/2019 | Yang et al. | |
| 2019/0296857 | A1* | 9/2019 | Gritsenko | H03M 13/3769 |
| 2020/0052718 | A1* | 2/2020 | Prinz | H03M 13/1148 |
| 2020/0099469 | A1* | 3/2020 | Jiang | H04L 1/0057 |
| 2020/0382138 | A1* | 12/2020 | Fazeli Chaghooshi | H04L 1/0065 |
| 2021/0306005 | A1* | 9/2021 | Sheiman | H03M 13/13 |
| 2023/0113448 | A1* | 4/2023 | Dai | H03M 13/6362 714/746 |
| 2023/0119851 | A1* | 4/2023 | Jang | H04L 1/0065 714/726 |

OTHER PUBLICATIONS

He et al., "Beta-Expansion: A Theoretical Framework for Fast and Recursive Construction of Polar Codes," Globecom 2017—2017 IEEE Global Communications Conference, pp. 1-6, (Dec. 2017).

IEEE Standard for Information technology—Telecommunications and information exchange between systems—Local and metropolitan area networks—Specific requirements; Part 11: Wireless LAN Medium Access Control (MAC) and Physical Layer (PHY) specifications, IEEE Std. 802.11-2016 (Dec. 7, 2016).

IEEE Standard for Information technology—Telecommunications and information exchange between systems—Local and metropolitan area networks—Specific requirements; Part 11: Wireless LAN Medium Access Control (MAC) and Physical Layer (PHY) Specifications; Amendment 4: Enhancements for Very High Throughput for Operation in Bands below 6GHZ, IEEE Std 802.11ac-2013 (Dec. 11, 2013).

IEEE Standard for Information Technology—Telecommunications and information exchange between systems—Local and metropolitan area networks—Specific requirements; Part 11: Wireless LAN Medium Access Control (MAC) and Physical Layer (PHY) specifications; Amendment 5: Television White Spaces (TVWS) Operation, IEEE 802.11af-2013 (Dec. 11, 2013).

IEEE Standard for Information technology—Telecommunications and information exchange between systems—Local and metropolitan area networks—Specific requirements; Part 11: Wireless LAN Medium Access Control (MAC) and Physical Layer (PHY) Specifications; Amendment 5: Enhancements for Higher Throughput, IEEE Std 802.11n-2009 (Sep. 2009).

IEEE Standard for Information technology—Telecommunications and information exchange between systems Local and metropolitan area networks—Specific requirements; Part 11: Wireless LAN Medium Access Control (MAC) and Physical Layer (PHY) Specifications; Amendment 2: Sub 1 GHz License Exempt Operation, IEEE 802.11ah-2016 (Dec. 7, 2016).

Niu et al., "CRC-Aided Decoding of Polar Codes," IEEE Communications Letters, vol. 16, No. 10, pp. 1668-1671, Oct. 2012.

Samsung, "Consideration on Polar Codes for High Order Modulation," 3GPP TSG RAN WG1 #89, R1-1708050, Hangzhou, China (May 15-19, 2017).

Tal et al., "List Decoding of Polar Codes," arXiv:1206.0050v1 [cs.IT] (May 31, 2012).

Third Generation Partnership Project, "Technical Specification Group Radio Access Network; NR; Multiplexing and channel coding (Release 15)," 3GPP TS 38.212 V15.0.0 (Dec. 2017).

Third Generation Partnership Project, "Technical Specification Group Radio Access Network; NR; Multiplexing and channel coding (Release 15)," 3GPP TS 38.212 V15.9.0 (Jun. 2020).

Third Generation Partnership Project, "Technical Specification Group Radio Access Network; NR; Multiplexing and channel coding (Release 16)," 3GPP TS 38.212 V16.2.0 (Jun. 2020).

Third Generation Partnership Project, "Technical Specification Group Radio Access Network; NR; Multiplexing and channel coding (Release 15)," 3GPP TS 38.212 V15.6.0 (Jun. 2019).

Tian et al., "Low-Complexity Hybrid ARQ Scheme for Polar Codes with Higher-Order Modulation," Globecom 2017—2017 IEEE Global Communications Conference, pp. 1-6 (2017).

Vangala et al., "A Comparative Study of Polar Code Constructions for the AWGN Channel," arXiv:1501.02473v1 [cs.IT] (Jan. 11, 2015).

Zhang et al., "Joint processing precoding algorithm for coordinated multi-point transmission in LTE-A system," Applied Science and Technology, vol. 40, No. 3 (Jun. 2013).

* cited by examiner

1110 — Offset Added

| Reliability | Input Index |
|---|---|
| 0 | 0 |
| 1 | 1 |
| 2 | 2 |
| 3 | 4 |
| 4+5 | 8 |
| 5 | 3 |
| 6 | 5 |
| 7 | 6 |
| 8+5 | 9 |
| 9+5 | 10 |
| 10+5 | 12 |
| 11 | 7 |
| 12+5 | 11 |
| 13+5 | 13 |
| 14+5 | 14 |
| 15+5 | 15 |

1120 — Offset Added

| Reliability | Input Index |
|---|---|
| 0 | 0 |
| 1 | 1 |
| 2 | 2 |
| 3 | 4 |
| 9 | 8 |
| 5 | 3 |
| 6 | 5 |
| 7 | 6 |
| 13 | 9 |
| 14 | 10 |
| 15 | 12 |
| 11 | 7 |
| 17 | 11 |
| 18 | 13 |
| 19 | 14 |
| 20 | 15 |

1130 — After Sorting

| Reliability | Input Index |
|---|---|
| 0 | 0 |
| 1 | 1 |
| 2 | 2 |
| 3 | 4 |
| 5 | 3 |
| 6 | 5 |
| 7 | 6 |
| 9 | 8 |
| 11 | 7 |
| 13 | 9 |
| 14 | 10 |
| 15 | 12 |
| 17 | 11 |
| 18 | 13 |
| 19 | 14 |
| 20 | 15 |

FIG. 11

METHODS AND PROCEDURES FOR POLAR CODED MODULATION

CROSS-REFERENCE TO RELATED APPLICATIONS

This application is the U.S. National Stage, under 35 U.S.C. § 371, of International Application No. PCT/US2020/050716 filed Sep. 14, 2020, which claims the benefit of U.S. Provisional Application No. 62/900,173, filed Sep. 13, 2019, the contents of which are incorporated herein by reference.

BACKGROUND

Polar codes may be the first channel code type analytically proven to be capacity achieving. Polar codes may show comparable performance to conventional LDPC codes or turbo codes with low or no error floor when aided by the embedded CRC, particularly for small to medium block lengths. Polar codes with successive cancellation decoding may require relatively low encoding and decoding complexities. However, the decoding complexity may increase in proportion to the list-size when the CRC-aided list decoding is adopted as well as the block-length of the codeword. The complexity increase may become a central issue particularly in medium to large block-lengths, and limit the adoption of polar codes for high throughput regime including 5G NR eMBB data rates (~20 Gbps) and above.

SUMMARY

Methods, apparatuses and systems are provided for constructing and modulating polar codes. Such procedures may involve identifying nonuniform channel conditions, selecting a modulation order, configuring a plurality of component codes and incremental ratios for Unequal Error Protection (UEP), identifying initial code construction parameters for each component code, calculating modified code construction parameters based on the incremental ratios for UEP, and encoding the component polar codes according to the modified construction parameters. Each component code may be comprised of a plurality of input bits. The initial and modified code construction parameters may include a number of unfrozen and frozen input bits, and identifying a number of unfrozen and frozen input bits may involve calculating and comparing reliability values for each bit. Calculating and comparing reliability values for each bit may involve applying a Polarization Weight (PW)-based method.

BRIEF DESCRIPTION OF THE DRAWINGS

A more detailed understanding may be had from the following description, given by way of example in conjunction with the accompanying drawings, wherein like reference numerals in the figures indicate like elements, and wherein:

FIG. 11 is a diagram of an example of generating new code construction sequence by offset.

DETAILED DESCRIPTION

Figure 1A:
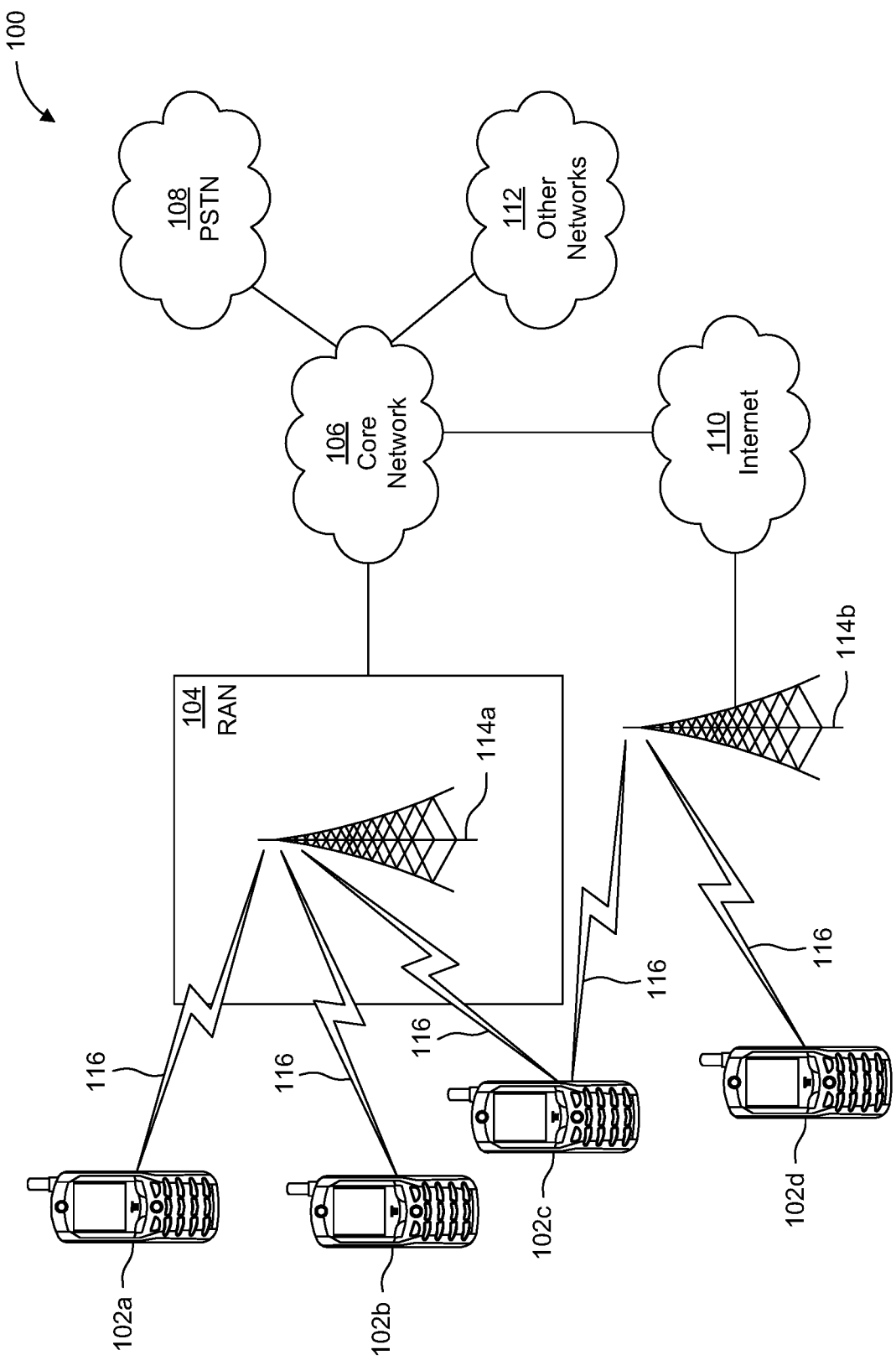
FIG. 1A is a system diagram illustrating an example communications system in which one or more disclosed embodiments may be implemented.

FIG. 1A is a diagram illustrating an example communications system 100 in which one or more disclosed embodiments may be implemented. The communications system 100 may be a multiple access system that provides content, such as voice, data, video, messaging, broadcast, etc., to multiple wireless users. The communications system 100 may enable multiple wireless users to access such content through the sharing of system resources, including wireless bandwidth. For example, the communications systems 100 may employ one or more channel access methods, such as code division multiple access (CDMA), time division multiple access (TDMA), frequency division multiple access (FDMA), orthogonal FDMA (OFDMA), single-carrier FDMA (SC-FDMA), zero-tail unique-word discrete Fourier transform Spread OFDM (ZT-UW-DFT-S-OFDM), unique word OFDM (UW-OFDM), resource block-filtered OFDM, filter bank multicarrier (FBMC), and the like.

As shown in FIG. 1A, the communications system 100 may include wireless transmit/receive units (WTRUs) 102a, 102b, 102c, 102d, a radio access network (RAN) 104, a core network (CN) 106, a public switched telephone network (PSTN) 108, the Internet 110, and other networks 112, though it will be appreciated that the disclosed embodiments contemplate any number of WTRUs, base stations, networks, and/or network elements. Each of the WTRUs 102a, 102b, 102c, 102d may be any type of device configured to operate and/or communicate in a wireless environment. By way of example, the WTRUs 102a, 102b, 102c, 102d, any of which may be referred to as a station (STA), may be configured to transmit and/or receive wireless signals and may include a user equipment (UE), a mobile station, a fixed or mobile subscriber unit, a subscription-based unit, a pager, a cellular telephone, a personal digital assistant (PDA), a smartphone, a laptop, a netbook, a personal computer, a wireless sensor, a hotspot or Mi-Fi device, an Internet of Things (IoT) device, a watch or other wearable, a head-mounted display (HMD), a vehicle, a drone, a medical device and applications (e.g., remote surgery), an industrial device and applications (e.g., a robot and/or other wireless devices operating in an industrial and/or an automated processing chain contexts), a consumer electronics device, a device operating on commercial and/or industrial wireless networks, and the like. Any of the WTRUs 102a, 102b, 102c and 102d may be interchangeably referred to as a UE.

The communications systems 100 may also include a base station 114a and/or a base station 114b. Each of the base stations 114a, 114b may be any type of device configured to wirelessly interface with at least one of the WTRUs 102a, 102b, 102c, 102d to facilitate access to one or more communication networks, such as the CN 106, the Internet 110, and/or the other networks 112. By way of example, the base stations 114a, 114b may be a base transceiver station (BTS), a NodeB, an eNode B (eNB), a Home Node B, a Home eNode B, a next generation NodeB, such as a gNode B (g NB), a new radio (NR) NodeB, a site controller, an access point (AP), a wireless router, and the like. While the base stations 114a, 114b are each depicted as a single element, it will be appreciated that the base stations 114a, 114b may include any number of interconnected base stations and/or network elements.

The base station 114a may be part of the RAN 104, which may also include other base stations and/or network elements (not shown), such as a base station controller (BSC), a radio network controller (RNC), relay nodes, and the like. The base station 114a and/or the base station 114b may be configured to transmit and/or receive wireless signals on one or more carrier frequencies, which may be referred to as a cell (not shown). These frequencies may be in licensed spectrum, unlicensed spectrum, or a combination of licensed and unlicensed spectrum. A cell may provide coverage for a wireless service to a specific geographical area that may be relatively fixed or that may change over time. The cell may further be divided into cell sectors. For example, the cell associated with the base station 114a may be divided into three sectors. Thus, in one embodiment, the base station 114a may include three transceivers, i.e., one for each sector of the cell. In an embodiment, the base station 114a may employ multiple-input multiple output (MIMO) technology and may utilize multiple transceivers for each sector of the cell. For example, beamforming may be used to transmit and/or receive signals in desired spatial directions.

The base stations 114a, 114b may communicate with one or more of the WTRUs 102a, 102b, 102c, 102d over an air interface 116, which may be any suitable wireless communication link (e.g., radio frequency (RF), microwave, centimeter wave, micrometer wave, infrared (IR), ultraviolet (UV), visible light, etc.). The air interface 116 may be established using any suitable radio access technology (RAT).

More specifically, as noted above, the communications system 100 may be a multiple access system and may employ one or more channel access schemes, such as CDMA, TDMA, FDMA, OFDMA, SC-FDMA, and the like. For example, the base station 114a in the RAN 104 and the WTRUs 102a, 102b, 102c may implement a radio technology such as Universal Mobile Telecommunications System (UMTS) Terrestrial Radio Access (UTRA), which may establish the air interface 116 using wideband CDMA (WCDMA). WCDMA may include communication protocols such as High-Speed Packet Access (HSPA) and/or Evolved HSPA (HSPA+). HSPA may include High-Speed Downlink (DL) Packet Access (HSDPA) and/or High-Speed Uplink (UL) Packet Access (HSUPA).

In an embodiment, the base station 114a and the WTRUs 102a, 102b, 102c may implement a radio technology such as Evolved UMTS Terrestrial Radio Access (E-UTRA), which may establish the air interface 116 using Long Term Evolution (LTE) and/or LTE-Advanced (LTE-A) and/or LTE-Advanced Pro (LTE-A Pro).

In an embodiment, the base station 114a and the WTRUs 102a, 102b, 102c may implement a radio technology such as NR Radio Access, which may establish the air interface 116 using NR.

In an embodiment, the base station 114a and the WTRUs 102a, 102b, 102c may implement multiple radio access technologies. For example, the base station 114a and the WTRUs 102a, 102b, 102c may implement LTE radio access and NR radio access together, for instance using dual connectivity (DC) principles. Thus, the air interface utilized by WTRUs 102a, 102b, 102c may be characterized by multiple types of radio access technologies and/or transmissions sent to/from multiple types of base stations (e.g., an eNB and a g NB).

In other embodiments, the base station 114a and the WTRUs 102a, 102b, 102c may implement radio technologies such as IEEE 802.11 (i.e., Wireless Fidelity (WiFi), IEEE 802.16 (i.e., Worldwide Interoperability for Microwave Access (WiMAX)), CDMA2000, CDMA2000 1x, CDMA2000 EV-DO, Interim Standard 2000 (IS-2000), Interim Standard 95 (IS-95), Interim Standard 856 (IS-856), Global System for Mobile communications (GSM), Enhanced Data rates for GSM Evolution (EDGE), GSM EDGE (GERAN), and the like.

The base station 114b in FIG. 1A may be a wireless router, Home Node B, Home eNode B, or access point, for example, and may utilize any suitable RAT for facilitating wireless connectivity in a localized area, such as a place of business, a home, a vehicle, a campus, an industrial facility, an air corridor (e.g., for use by drones), a roadway, and the like. In one embodiment, the base station 114b and the WTRUs 102c, 102d may implement a radio technology such as IEEE 802.11 to establish a wireless local area network (WLAN). In an embodiment, the base station 114b and the WTRUs 102c, 102d may implement a radio technology such as IEEE 802.15 to establish a wireless personal area network (WPAN). In yet another embodiment, the base station 114b and the WTRUs 102c, 102d may utilize a cellular-based RAT (e.g., WCDMA, CDMA2000, GSM, LTE, LTE-A, LTE-A Pro, NR etc.) to establish a picocell or femtocell. As shown in FIG. 1A, the base station 114b may have a direct connection to the Internet 110. Thus, the base station 114b may not be required to access the Internet 110 via the CN 106.

The RAN 104 may be in communication with the CN 106, which may be any type of network configured to provide voice, data, applications, and/or voice over internet protocol (VoIP) services to one or more of the WTRUs 102a, 102b, 102c, 102d. The data may have varying quality of service (QoS) requirements, such as differing throughput requirements, latency requirements, error tolerance requirements, reliability requirements, data throughput requirements, mobility requirements, and the like. The CN 106 may provide call control, billing services, mobile location-based services, pre-paid calling, Internet connectivity, video distribution, etc., and/or perform high-level security functions, such as user authentication. Although not shown in FIG. 1A, it will be appreciated that the RAN 104 and/or the CN 106 may be in direct or indirect communication with other RANs that employ the same RAT as the RAN 104 or a different RAT. For example, in addition to being connected to the RAN 104, which may be utilizing a NR radio technology, the CN 106 may also be in communication with another RAN (not shown) employing a GSM, UMTS, CDMA 2000, WiMAX, E-UTRA, or WiFi radio technology.

The CN 106 may also serve as a gateway for the WTRUs 102a, 102b, 102c, 102d to access the PSTN 108, the Internet 110, and/or the other networks 112. The PSTN 108 may include circuit-switched telephone networks that provide plain old telephone service (POTS). The Internet 110 may include a global system of interconnected computer networks and devices that use common communication protocols, such as the transmission control protocol (TCP), user datagram protocol (UDP) and/or the internet protocol (IP) in the TCP/IP internet protocol suite. The networks 112 may include wired and/or wireless communications networks owned and/or operated by other service providers. For example, the networks 112 may include another CN connected to one or more RANs, which may employ the same RAT as the RAN 104 or a different RAT.

Some or all of the WTRUs 102a, 102b, 102c, 102d in the communications system 100 may include multi-mode capabilities (e.g., the WTRUs 102a, 102b, 102c, 102d may include multiple transceivers for communicating with different wireless networks over different wireless links). For example, the WTRU 102c shown in FIG. 1A may be configured to communicate with the base station 114a, which may employ a cellular-based radio technology, and with the base station 114b, which may employ an IEEE 802 radio technology.

Figure 1B:
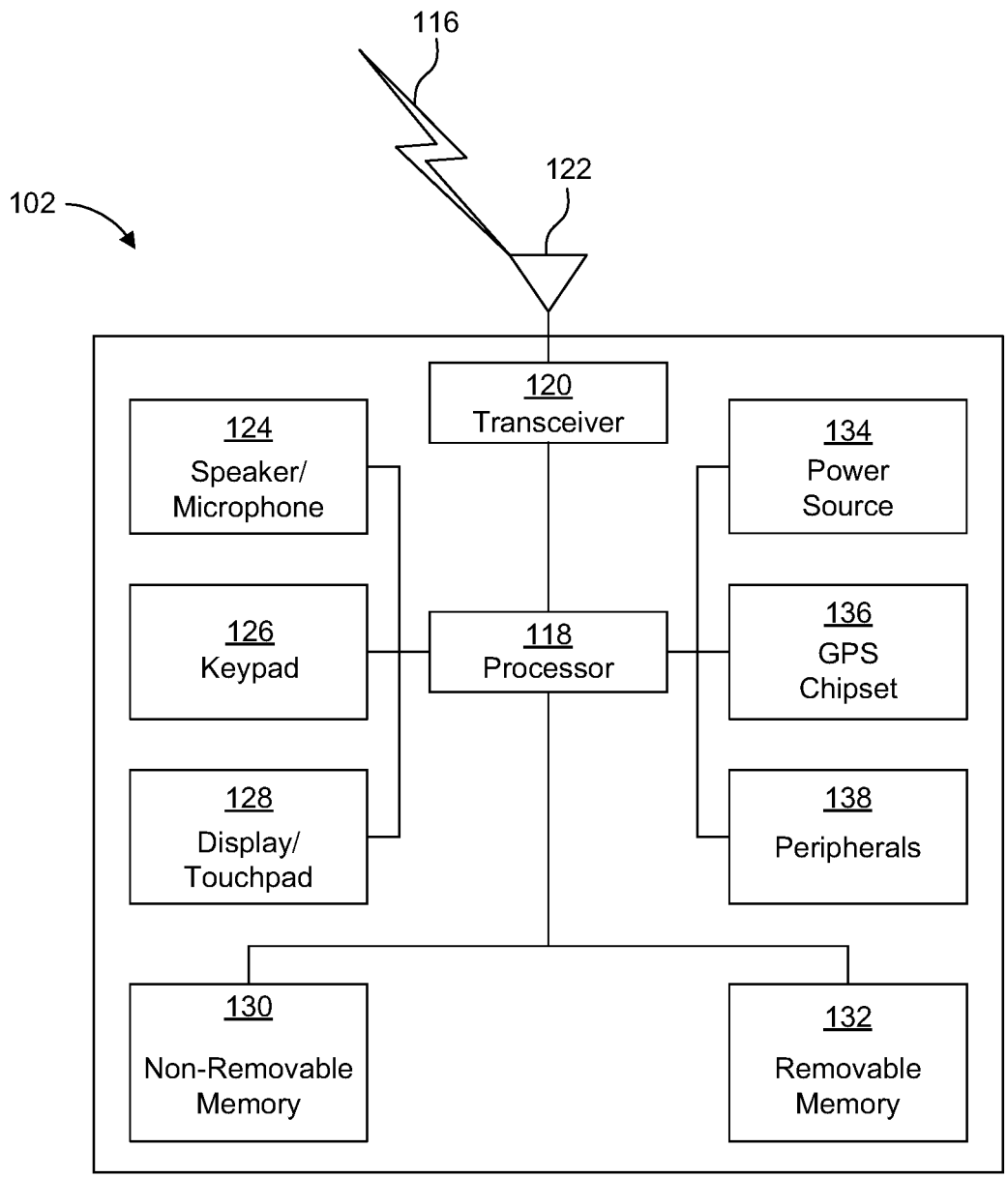
FIG. 1B is a system diagram illustrating an example wireless transmit/receive unit (WTRU) that may be used within the communications system illustrated in FIG. 1A according to an embodiment.

FIG. 1B is a system diagram illustrating an example WTRU 102. As shown in FIG. 1B, the WTRU 102 may include a processor 118, a transceiver 120, a transmit/receive element 122, a speaker/microphone 124, a keypad 126, a display/touchpad 128, non-removable memory 130, removable memory 132, a power source 134, a global positioning system (GPS) chipset 136, and/or other peripherals 138, among others. It will be appreciated that the WTRU 102 may include any sub-combination of the foregoing elements while remaining consistent with an embodiment.

The processor 118 may be a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs), any other type of integrated circuit (IC), a state machine, and the like. The processor 118 may perform signal coding, data processing, power control, input/output processing, and/or any other functionality that enables the WTRU 102 to operate in a wireless environment. The processor 118 may be coupled to the transceiver 120, which may be coupled to the transmit/receive element 122. While FIG. 1B depicts the processor 118 and the transceiver 120 as separate components, it will be appreciated that the processor 118 and the transceiver 120 may be integrated together in an electronic package or chip.

The transmit/receive element 122 may be configured to transmit signals to, or receive signals from, a base station (e.g., the base station 114a) over the air interface 116. For example, in one embodiment, the transmit/receive element 122 may be an antenna configured to transmit and/or receive RF signals. In an embodiment, the transmit/receive element 122 may be an emitter/detector configured to transmit and/or receive IR, UV, or visible light signals, for example. In yet another embodiment, the transmit/receive element 122 may be configured to transmit and/or receive both RF and light signals. It will be appreciated that the transmit/receive element 122 may be configured to transmit and/or receive any combination of wireless signals.

Although the transmit/receive element 122 is depicted in FIG. 1B as a single element, the WTRU 102 may include any number of transmit/receive elements 122. More specifically, the WTRU 102 may employ MIMO technology. Thus, in one embodiment, the WTRU 102 may include two or more transmit/receive elements 122 (e.g., multiple antennas) for transmitting and receiving wireless signals over the air interface 116.

The transceiver 120 may be configured to modulate the signals that are to be transmitted by the transmit/receive element 122 and to demodulate the signals that are received by the transmit/receive element 122. As noted above, the WTRU 102 may have multi-mode capabilities. Thus, the transceiver 120 may include multiple transceivers for enabling the WTRU 102 to communicate via multiple RATs, such as NR and IEEE 802.11, for example.

The processor 118 of the WTRU 102 may be coupled to, and may receive user input data from, the speaker/microphone 124, the keypad 126, and/or the display/touchpad 128 (e.g., a liquid crystal display (LCD) display unit or organic light-emitting diode (OLED) display unit). The processor 118 may also output user data to the speaker/microphone 124, the keypad 126, and/or the display/touchpad 128. In addition, the processor 118 may access information from, and store data in, any type of suitable memory, such as the non-removable memory 130 and/or the removable memory 132. The non-removable memory 130 may include random-access memory (RAM), read-only memory (ROM), a hard disk, or any other type of memory storage device. The removable memory 132 may include a subscriber identity module (SIM) card, a memory stick, a secure digital (SD) memory card, and the like. In other embodiments, the processor 118 may access information from, and store data in, memory that is not physically located on the WTRU 102, such as on a server or a home computer (not shown).

The processor 118 may receive power from the power source 134, and may be configured to distribute and/or control the power to the other components in the WTRU 102. The power source 134 may be any suitable device for powering the WTRU 102. For example, the power source 134 may include one or more dry cell batteries (e.g., nickel-cadmium (NiCd), nickel-zinc (NiZn), nickel metal hydride (NiMH), lithium-ion (Li-ion), etc.), solar cells, fuel cells, and the like.

The processor 118 may also be coupled to the GPS chipset 136, which may be configured to provide location information (e.g., longitude and latitude) regarding the current location of the WTRU 102. In addition to, or in lieu of, the information from the GPS chipset 136, the WTRU 102 may receive location information over the air interface 116 from a base station (e.g., base stations 114a, 114b) and/or determine its location based on the timing of the signals being received from two or more nearby base stations. It will be appreciated that the WTRU 102 may acquire location information by way of any suitable location-determination method while remaining consistent with an embodiment.

The processor 118 may further be coupled to other peripherals 138, which may include one or more software and/or hardware modules that provide additional features, functionality and/or wired or wireless connectivity. For example, the peripherals 138 may include an accelerometer, an e-compass, a satellite transceiver, a digital camera (for photographs and/or video), a universal serial bus (USB)

port, a vibration device, a television transceiver, a hands free headset, a Bluetooth® module, a frequency modulated (FM) radio unit, a digital music player, a media player, a video game player module, an Internet browser, a Virtual Reality and/or Augmented Reality (VR/AR) device, an activity tracker, and the like. The peripherals 138 may include one or more sensors. The sensors may be one or more of a gyroscope, an accelerometer, a hall effect sensor, a magnetometer, an orientation sensor, a proximity sensor, a temperature sensor, a time sensor; a geolocation sensor, an altimeter, a light sensor, a touch sensor, a magnetometer, a barometer, a gesture sensor, a biometric sensor, a humidity sensor and the like.

The WTRU 102 may include a full duplex radio for which transmission and reception of some or all of the signals (e.g., associated with particular subframes for both the UL (e.g., for transmission) and DL (e.g., for reception) may be concurrent and/or simultaneous. The full duplex radio may include an interference management unit to reduce and or substantially eliminate self-interference via either hardware (e.g., a choke) or signal processing via a processor (e.g., a separate processor (not shown) or via processor 118). In an embodiment, the WTRU 102 may include a half-duplex radio for which transmission and reception of some or all of the signals (e.g., associated with particular subframes for either the UL (e.g., for transmission) or the DL (e.g., for reception)).

Figure 1C:
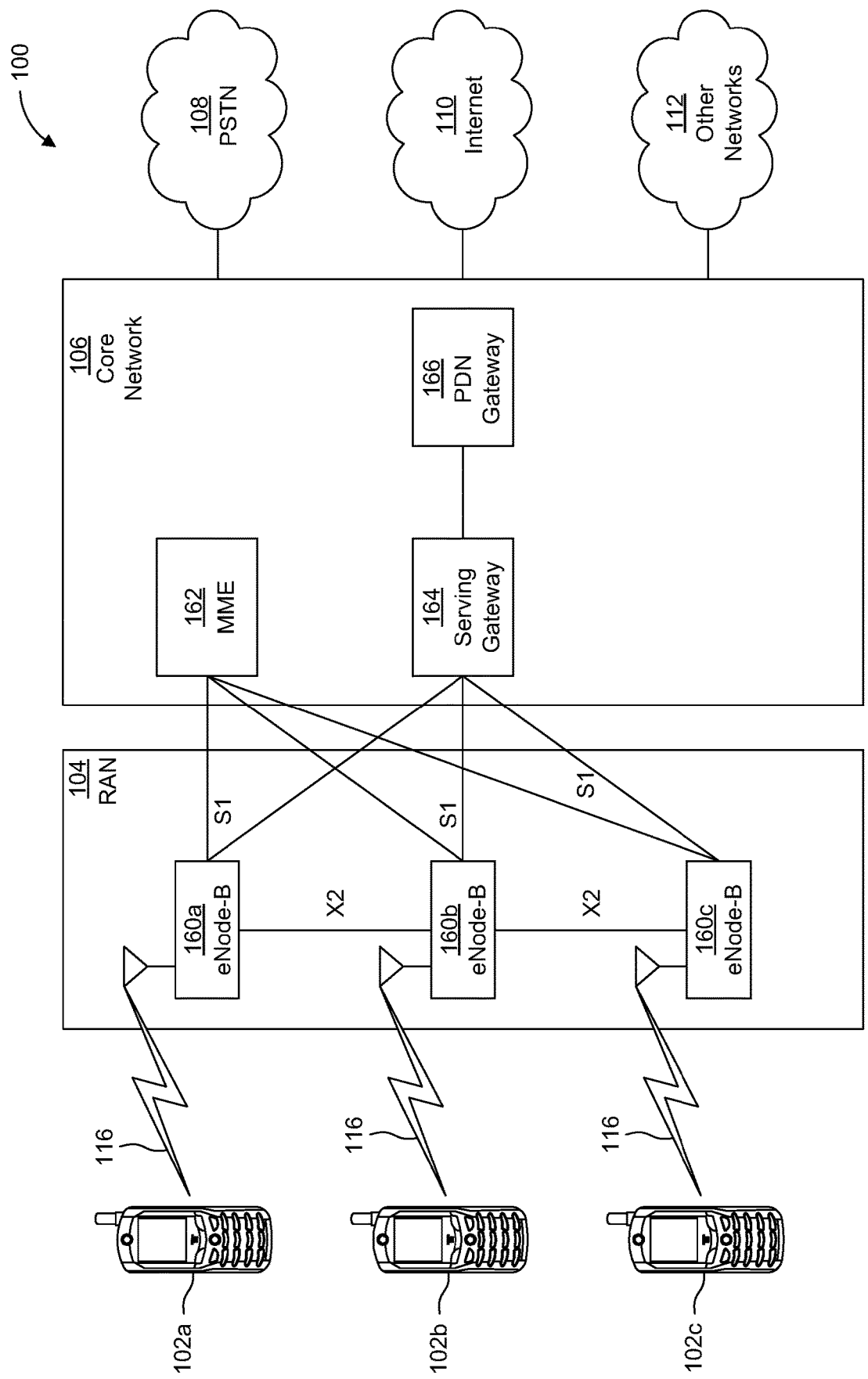
FIG. 1C is a system diagram illustrating an example radio access network (RAN) and an example core network (CN) that may be used within the communications system illustrated in FIG. 1A according to an embodiment.

FIG. 1C is a system diagram illustrating the RAN 104 and the CN 106 according to an embodiment. As noted above, the RAN 104 may employ an E-UTRA radio technology to communicate with the WTRUs 102a, 102b, 102c over the air interface 116. The RAN 104 may also be in communication with the CN 106.

The RAN 104 may include eNode-Bs 160a, 160b, 160c, though it will be appreciated that the RAN 104 may include any number of eNode-Bs while remaining consistent with an embodiment. The eNode-Bs 160a, 160b, 160c may each include one or more transceivers for communicating with the WTRUs 102a, 102b, 102c over the air interface 116. In one embodiment, the eNode-Bs 160a, 160b, 160c may implement MIMO technology. Thus, the eNode-B 160a, for example, may use multiple antennas to transmit wireless signals to, and/or receive wireless signals from, the WTRU 102a.

Each of the eNode-Bs 160a, 160b, 160c may be associated with a particular cell (not shown) and may be configured to handle radio resource management decisions, handover decisions, scheduling of users in the UL and/or DL, and the like. As shown in FIG. 1C, the eNode-Bs 160a, 160b, 160c may communicate with one another over an X2 interface.

The CN 106 shown in FIG. 1C may include a mobility management entity (MME) 162, a serving gateway (SGW) 164, and a packet data network (PDN) gateway (PGW) 166. While the foregoing elements are depicted as part of the CN 106, it will be appreciated that any of these elements may be owned and/or operated by an entity other than the CN operator.

The MME 162 may be connected to each of the eNode-Bs 162a, 162b, 162c in the RAN 104 via an S1 interface and may serve as a control node. For example, the MME 162 may be responsible for authenticating users of the WTRUs 102a, 102b, 102c, bearer activation/deactivation, selecting a particular serving gateway during an initial attach of the WTRUs 102a, 102b, 102c, and the like. The MME 162 may provide a control plane function for switching between the RAN 104 and other RANs (not shown) that employ other radio technologies, such as GSM and/or WCDMA.

The SGW 164 may be connected to each of the eNode Bs 160a, 160b, 160c in the RAN 104 via the S1 interface. The SGW 164 may generally route and forward user data packets to/from the WTRUs 102a, 102b, 102c. The SGW 164 may perform other functions, such as anchoring user planes during inter-eNode B handovers, triggering paging when DL data is available for the WTRUs 102a, 102b, 102c, managing and storing contexts of the WTRUs 102a, 102b, 102c, and the like.

The SGW 164 may be connected to the PGW 166, which may provide the WTRUs 102a, 102b, 102c with access to packet-switched networks, such as the Internet 110, to facilitate communications between the WTRUs 102a, 102b, 102c and IP-enabled devices.

The CN 106 may facilitate communications with other networks. For example, the CN 106 may provide the WTRUs 102a, 102b, 102c with access to circuit-switched networks, such as the PSTN 108, to facilitate communications between the WTRUs 102a, 102b, 102c and traditional land-line communications devices. For example, the CN 106 may include, or may communicate with, an IP gateway (e.g., an IP multimedia subsystem (IMS) server) that serves as an interface between the CN 106 and the PSTN 108. In addition, the CN 106 may provide the WTRUs 102a, 102b, 102c with access to the other networks 112, which may include other wired and/or wireless networks that are owned and/or operated by other service providers.

Although the WTRU is described in FIGS. 1A-1D as a wireless terminal, it is contemplated that in certain representative embodiments that such a terminal may use (e.g., temporarily or permanently) wired communication interfaces with the communication network.

In representative embodiments, the other network 112 may be a WLAN.

A WLAN in Infrastructure Basic Service Set (BSS) mode may have an Access Point (AP) for the BSS and one or more stations (STAs) associated with the AP. The AP may have access or an interface to a Distribution System (DS) or another type of wired/wireless network that carries traffic in to and/or out of the BSS. Traffic to STAs that originates from outside the BSS may arrive through the AP and may be delivered to the STAs. Traffic originating from STAs to destinations outside the BSS may be sent to the AP to be delivered to respective destinations. Traffic between STAs within the BSS may be sent through the AP, for example, where the source STA may send traffic to the AP and the AP may deliver the traffic to the destination STA. The traffic between STAs within a BSS may be considered and/or referred to as peer-to-peer traffic. The peer-to-peer traffic may be sent between (e.g., directly between) the source and destination STAs with a direct link setup (DLS). In certain representative embodiments, the DLS may use an 802.11e DLS or an 802.11z tunneled DLS (TDLS). A WLAN using an Independent BSS (IBSS) mode may not have an AP, and the STAs (e.g., all of the STAs) within or using the IBSS may communicate directly with each other. The IBSS mode of communication may sometimes be referred to herein as an "ad-hoc" mode of communication.

When using the 802.11ac infrastructure mode of operation or a similar mode of operations, the AP may transmit a beacon on a fixed channel, such as a primary channel. The primary channel may be a fixed width (e.g., 20 MHz wide bandwidth) or a dynamically set width. The primary channel may be the operating channel of the BSS and may be used by the STAs to establish a connection with the AP. In certain representative embodiments, Carrier Sense Multiple Access with Collision Avoidance (CSMA/CA) may be implemented, for example in 802.11 systems. For CSMA/CA, the STAs (e.g., every STA), including the AP, may sense the primary channel. If the primary channel is sensed/detected and/or determined to be busy by a particular STA, the particular STA may back off. One STA (e.g., only one station) may transmit at any given time in a given BSS.

High Throughput (HT) STAs may use a 40 MHz wide channel for communication, for example, via a combination of the primary 20 MHz channel with an adjacent or nonadjacent 20 MHz channel to form a 40 MHz wide channel.

Very High Throughput (VHT) STAs may support 20 MHz, 40 MHz, 80 MHz, and/or 160 MHz wide channels. The 40 MHz, and/or 80 MHz, channels may be formed by combining contiguous 20 MHz channels. A 160 MHz channel may be formed by combining 8 contiguous 20 MHz channels, or by combining two non-contiguous 80 MHz channels, which may be referred to as an 80+80 configuration. For the 80+80 configuration, the data, after channel encoding, may be passed through a segment parser that may divide the data into two streams. Inverse Fast Fourier Transform (IFFT) processing, and time domain processing, may be done on each stream separately. The streams may be mapped on to the two 80 MHz channels, and the data may be transmitted by a transmitting STA. At the receiver of the receiving STA, the above described operation for the 80+80 configuration may be reversed, and the combined data may be sent to the Medium Access Control (MAC).

Sub 1 GHz modes of operation are supported by 802.11af and 802.11ah. The channel operating bandwidths, and carriers, are reduced in 802.11af and 802.11ah relative to those used in 802.11n, and 802.11ac. 802.11af supports 5 MHz, 10 MHz, and 20 MHz bandwidths in the TV White Space (TVWS) spectrum, and 802.11ah supports 1 MHz, 2 MHz, 4 MHz, 8 MHz, and 16 MHz bandwidths using non-TVWS spectrum. According to a representative embodiment, 802.11ah may support Meter Type Control/Machine-Type Communications (MTC), such as MTC devices in a macro coverage area. MTC devices may have certain capabilities, for example, limited capabilities including support for (e.g., only support for) certain and/or limited bandwidths. The MTC devices may include a battery with a battery life above a threshold (e.g., to maintain a very long battery life).

WLAN systems, which may support multiple channels, and channel bandwidths, such as 802.11n, 802.11ac, 802.11af, and 802.11ah, include a channel which may be designated as the primary channel. The primary channel may have a bandwidth equal to the largest common operating bandwidth supported by all STAs in the BSS. The bandwidth of the primary channel may be set and/or limited by a STA, from among all STAs in operating in a BSS, which supports the smallest bandwidth operating mode. In the example of 802.11ah, the primary channel may be 1 MHz wide for STAs (e.g., MTC type devices) that support (e.g., only support) a 1 MHz mode, even if the AP, and other STAs in the BSS, support 2 MHz, 4 MHz, 8 MHz, 16 MHz, and/or other channel bandwidth operating modes. Carrier sensing and/or Network Allocation Vector (NAV) settings may depend on the status of the primary channel. If the primary channel is busy, for example, due to a STA (which supports only a 1 MHz operating mode) transmitting to the AP, all available frequency bands may be considered busy even though a majority of the available frequency bands remains idle.

In the United States, the available frequency bands, which may be used by 802.11ah, are from 902 MHz to 928 MHz. In Korea, the available frequency bands are from 917.5 MHz to 923.5 MHz. In Japan, the available frequency bands are from 916.5 MHz to 927.5 MHz. The total bandwidth available for 802.11ah is 6 MHz to 26 MHz depending on the country code.

Figure 1D:
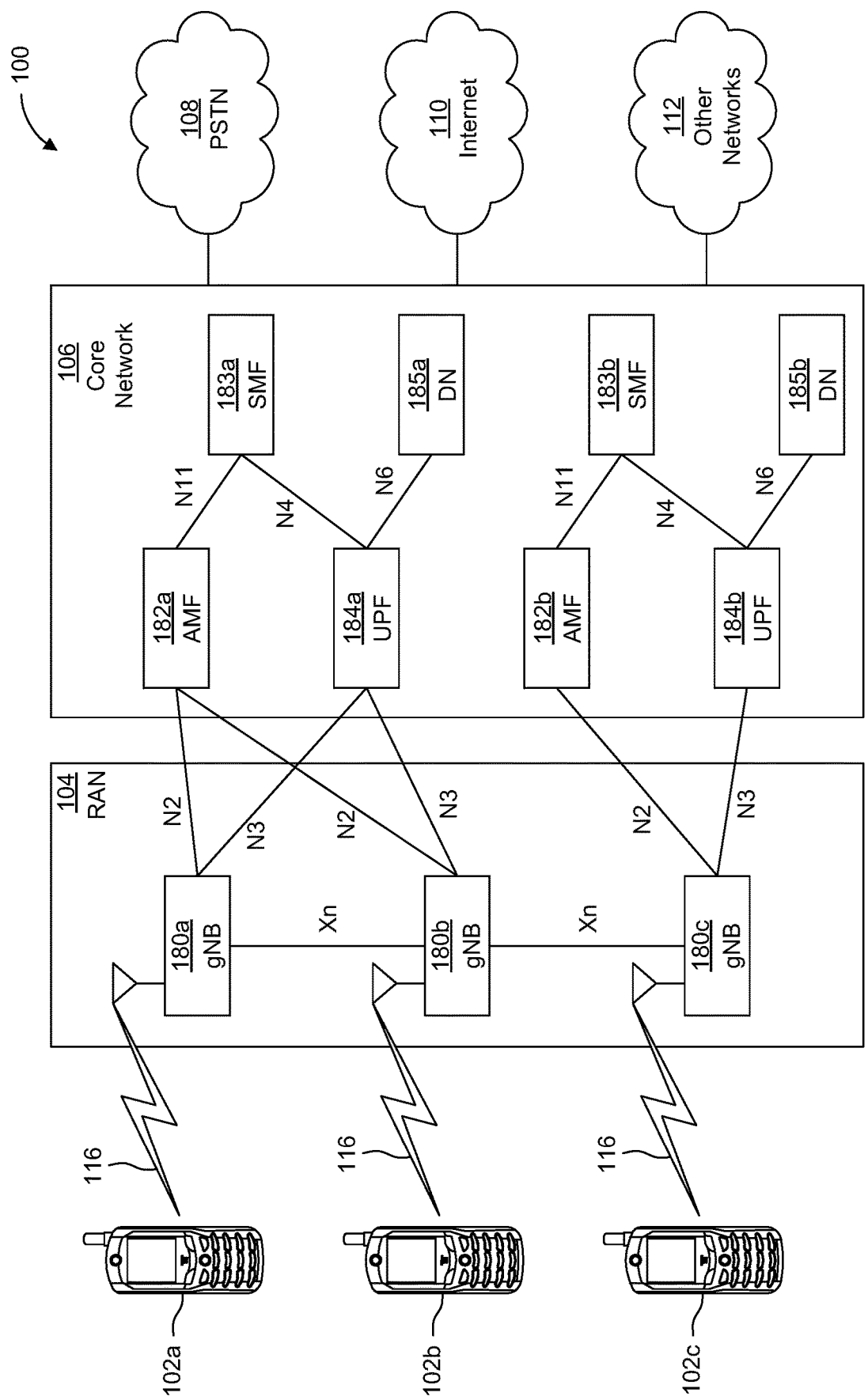
FIG. 1D is a system diagram illustrating a further example RAN and a further example CN that may be used within the communications system illustrated in FIG. 1A according to an embodiment.

FIG. 1D is a system diagram illustrating the RAN 104 and the CN 106 according to an embodiment. As noted above, the RAN 104 may employ an NR radio technology to communicate with the WTRUs 102a, 102b, 102c over the air interface 116. The RAN 104 may also be in communication with the CN 106.

The RAN 104 may include gNBs 180a, 180b, 180c, though it will be appreciated that the RAN 104 may include any number of gNBs while remaining consistent with an embodiment. The gNBs 180a, 180b, 180c may each include one or more transceivers for communicating with the WTRUs 102a, 102b, 102c over the air interface 116. In one embodiment, the gNBs 180a, 180b, 180c may implement MIMO technology. For example, gNBs 180a, 108b may utilize beamforming to transmit signals to and/or receive signals from the gNBs 180a, 180b, 180c. Thus, the gNB 180a, for example, may use multiple antennas to transmit wireless signals to, and/or receive wireless signals from, the WTRU 102a. In an embodiment, the gNBs 180a, 180b, 180c may implement carrier aggregation technology. For example, the gNB 180a may transmit multiple component carriers to the WTRU 102a (not shown). A subset of these component carriers may be on unlicensed spectrum while the remaining component carriers may be on licensed spectrum. In an embodiment, the gNBs 180a, 180b, 180c may implement Coordinated Multi-Point (CoMP) technology. For example, WTRU 102a may receive coordinated transmissions from gNB 180a and gNB 180b (and/or gNB 180c).

The WTRUs 102a, 102b, 102c may communicate with gNBs 180a, 180b, 180c using transmissions associated with a scalable numerology. For example, the OFDM symbol spacing and/or OFDM subcarrier spacing may vary for different transmissions, different cells, and/or different portions of the wireless transmission spectrum. The WTRUs 102a, 102b, 102c may communicate with gNBs 180a, 180b, 180c using subframe or transmission time intervals (TTIs) of various or scalable lengths (e.g., containing a varying number of OFDM symbols and/or lasting varying lengths of absolute time).

The gNBs 180a, 180b, 180c may be configured to communicate with the WTRUs 102a, 102b, 102c in a standalone configuration and/or a non-standalone configuration. In the standalone configuration, WTRUs 102a, 102b, 102c may communicate with gNBs 180a, 180b, 180c without also accessing other RANs (e.g., such as eNode-Bs 160a, 160b, 160c). In the standalone configuration, WTRUs 102a, 102b, 102c may utilize one or more of gNBs 180a, 180b, 180c as a mobility anchor point. In the standalone configuration, WTRUs 102a, 102b, 102c may communicate with gNBs 180a, 180b, 180c using signals in an unlicensed band. In a non-standalone configuration WTRUs 102a, 102b, 102c may communicate with/connect to gNBs 180a, 180b, 180c while also communicating with/connecting to another RAN such as eNode-Bs 160a, 160b, 160c. For example, WTRUs 102a, 102b, 102c may implement DC principles to communicate with one or more gNBs 180a, 180b, 180c and one or more eNode-Bs 160a, 160b, 160c substantially simultaneously. In the non-standalone configuration, eNode-Bs 160a, 160b, 160c may serve as a mobility anchor for WTRUs 102a, 102b, 102c and gNBs 180a, 180b, 180c may provide additional coverage and/or throughput for servicing WTRUs 102a, 102b, 102c.

Each of the gNBs 180a, 180b, 180c may be associated with a particular cell (not shown) and may be configured to handle radio resource management decisions, handover decisions, scheduling of users in the UL and/or DL, support of network slicing, DC, interworking between NR and E-UTRA, routing of user plane data towards User Plane Function (UPF) 184a, 184b, routing of control plane information towards Access and Mobility Management Function (AMF) 182a, 182b and the like. As shown in FIG. 1D, the gNBs 180a, 180b, 180c may communicate with one another over an Xn interface.

The CN 106 shown in FIG. 1D may include at least one AMF 182a, 182b, at least one UPF 184a,184b, at least one Session Management Function (SMF) 183a, 183b, and possibly a Data Network (DN) 185a, 185b. While the foregoing elements are depicted as part of the CN 106, it will be appreciated that any of these elements may be owned and/or operated by an entity other than the CN operator.

The AMF 182a, 182b may be connected to one or more of the gNBs 180a, 180b, 180c in the RAN 104 via an N2 interface and may serve as a control node. For example, the AMF 182a, 182b may be responsible for authenticating users of the WTRUs 102a, 102b, 102c, support for network slicing (e.g., handling of different protocol data unit (PDU) sessions with different requirements), selecting a particular SMF 183a, 183b, management of the registration area, termination of non-access stratum (NAS) signaling, mobility management, and the like. Network slicing may be used by the AMF 182a, 182b in order to customize CN support for WTRUs 102a, 102b, 102c based on the types of services being utilized WTRUs 102a, 102b, 102c. For example, different network slices may be established for different use cases such as services relying on ultra-reliable low latency (URLLC) access, services relying on enhanced massive mobile broadband (eMBB) access, services for MTC access, and the like. The AMF 182a, 182b may provide a control plane function for switching between the RAN 104 and other RANs (not shown) that employ other radio technologies, such as LTE, LTE-A, LTE-A Pro, and/or non-3GPP access technologies such as WiFi.

The SMF 183a, 183b may be connected to an AMF 182a, 182b in the CN 106 via an N11 interface. The SMF 183a, 183b may also be connected to a UPF 184a, 184b in the CN 106 via an N4 interface. The SMF 183a, 183b may select and control the UPF 184a, 184b and configure the routing of traffic through the UPF 184a, 184b. The SMF 183a, 183b may perform other functions, such as managing and allocating UE IP address, managing PDU sessions, controlling policy enforcement and QoS, providing DL data notifications, and the like. A PDU session type may be IP-based, non-IP based, Ethernet-based, and the like.

The UPF 184a, 184b may be connected to one or more of the gNBs 180a, 180b, 180c in the RAN 104 via an N3 interface, which may provide the WTRUs 102a, 102b, 102c with access to packet-switched networks, such as the Internet 110, to facilitate communications between the WTRUs 102a, 102b, 102c and IP-enabled devices. The UPF 184, 184b may perform other functions, such as routing and forwarding packets, enforcing user plane policies, supporting multi-homed PDU sessions, handling user plane QoS, buffering DL packets, providing mobility anchoring, and the like.

The CN 106 may facilitate communications with other networks. For example, the CN 106 may include, or may communicate with, an IP gateway (e.g., an IP multimedia subsystem (IMS) server) that serves as an interface between the CN 106 and the PSTN 108. In addition, the CN 106 may provide the WTRUs 102a, 102b, 102c with access to the other networks 112, which may include other wired and/or wireless networks that are owned and/or operated by other service providers. In one embodiment, the WTRUs 102a, 102b, 102c may be connected to a local DN 185a, 185b through the UPF 184a, 184b via the N3 interface to the UPF 184a, 184b and an N6 interface between the UPF 184a, 184b and the DN 185a, 185b.

In view of FIGS. 1A-1D, and the corresponding description of FIGS. 1A-1D, one or more, or all, of the functions described herein with regard to one or more of: WTRU 102a-d, Base Station 114a-b, eNode-B 160a-c, MME 162, SGW 164, PGW 166, gNB 180a-c, AMF 182a-b, UPF 184a-b, SMF 183a-b, DN 185a-b, and/or any other device(s) described herein, may be performed by one or more emulation devices (not shown). The emulation devices may be one or more devices configured to emulate one or more, or all, of the functions described herein. For example, the emulation devices may be used to test other devices and/or to simulate network and/or WTRU functions.

The emulation devices may be designed to implement one or more tests of other devices in a lab environment and/or in an operator network environment. For example, the one or more emulation devices may perform the one or more, or all, functions while being fully or partially implemented and/or deployed as part of a wired and/or wireless communication network in order to test other devices within the communication network. The one or more emulation devices may perform the one or more, or all, functions while being temporarily implemented/deployed as part of a wired and/or wireless communication network. The emulation device may be directly coupled to another device for purposes of testing and/or performing testing using over-the-air wireless communications.

The one or more emulation devices may perform the one or more, including all, functions while not being implemented/deployed as part of a wired and/or wireless communication network. For example, the emulation devices may be utilized in a testing scenario in a testing laboratory and/or a non-deployed (e.g., testing) wired and/or wireless communication network in order to implement testing of one or more components. The one or more emulation devices may be test equipment. Direct RF coupling and/or wireless communications via RF circuitry (e.g., which may include one or more antennas) may be used by the emulation devices to transmit and/or receive data.

In one or more embodiments, a device, such as a WTRU or a base station, may perform one or more processes in order to send a transmission. For example, one or more transport blocks may be delivered to a physical layer of the device, where the transport blocks may undergo processing. Generally, channel coding may be performed as part of the physical layer process(es). There are multiple types of channel coding, such as low-density parity check (LDPC) code, turbo code, and polar code.

Polar codes may be the first channel code type analytically proven to be capacity achieving. Polar codes may show comparable performance to conventional LDPC codes or turbo codes with low or no error floor when aided by the embedded CRC, particularly for small to medium block lengths. Polar codes with successive cancellation decoding may require relatively low encoding and decoding complexities. However, the decoding complexity may increase in proportion to the list-size when the CRC-aided list decoding is adopted as well as the block-length of the codeword. The complexity increase may become a central issue, particularly in medium to large block-lengths, and limit the adoption of polar code for high throughput regimes, such as 5G NR eMBB that has high data rates (e.g., 20 Gbps and above).

Due to its superior performance in small block length, polar codes may be adopted as a channel coding scheme to control channel Forward Error Correction (FEC) operations. Polar code encoding may be defined as in the following equation:

$$c_1^N = u_1^N G_N \quad \text{Equation 1}$$

The codeword vector of polar code $c_1^N$ is generated by the product of the input vector $u_1^N$ and generator matrix $G_N$. $c_1^N$ and $u_1^N$ are binary vectors with length $N=2^n$, where N denotes the codeword block-length. The generator matrix $G_N$ may be defined by the Kronecker power of $$F = \begin{bmatrix} 1 & 0 \\ 1 & 1 \end{bmatrix}, G_N = F^{\otimes n} \quad \text{Equation 2}$$

where $(\ )^{\otimes n}$ stands for n-th Kronecker power of ( ). In Arikan's original paper, $G_N = B_N F^{\otimes n}$, where $B_N$ denotes the bit reversing matrix and it changes the order of elements in $u_1^N = [u_1, u_2, \ldots, u_N]$. The bit-reversing operation is further described below.

Generally, it may be assumed that $G_N = F^{\otimes n}$. Certain input bits for polar codes may have a fixed value (e.g., zero), in which case they are called "frozen bits". The input indexes for frozen bits may be represented by the set $A^c = \{a_1^c, a_2^c, a_3^c, \ldots, a_{N-K}^c\}$ and $a_i^c < a_j^c$ if $i<j$. The remaining part of input bits for a polar code may convey variable information bits and they are called "unfrozen bits." The input indexes for unfrozen bits may be represented by the set $A = \{a_1, a_2, a_3, \ldots, a_K\}$ and $a_i < a_j$ if $i<j$. The number of information bits, and/or unfrozen bits, may be defined as K and the number of frozen bits may be N−K. The code rate R of polar code can be defined as $$\frac{K}{N}.$$

The determination process of input bit indexes for frozen bits and unfrozen bits may be called "code construction" for polar code, and several code construction methods may be employed. In general, the methods may initially involve the calculation of the reliability of each input bit index, and therefore have an order of bit index reliabilities before starting the encoding operation. From the obtained reliability order, the least reliable input bits may be assigned as frozen bits and the remaining bits may be assigned as unfrozen/information bits. The proportion of frozen and unfrozen bits may be determined according to the desired code rate. With the frozen and unfrozen bit locations available, the encoding operation follows as shown in the example of FIG. 2.

Figure 2:
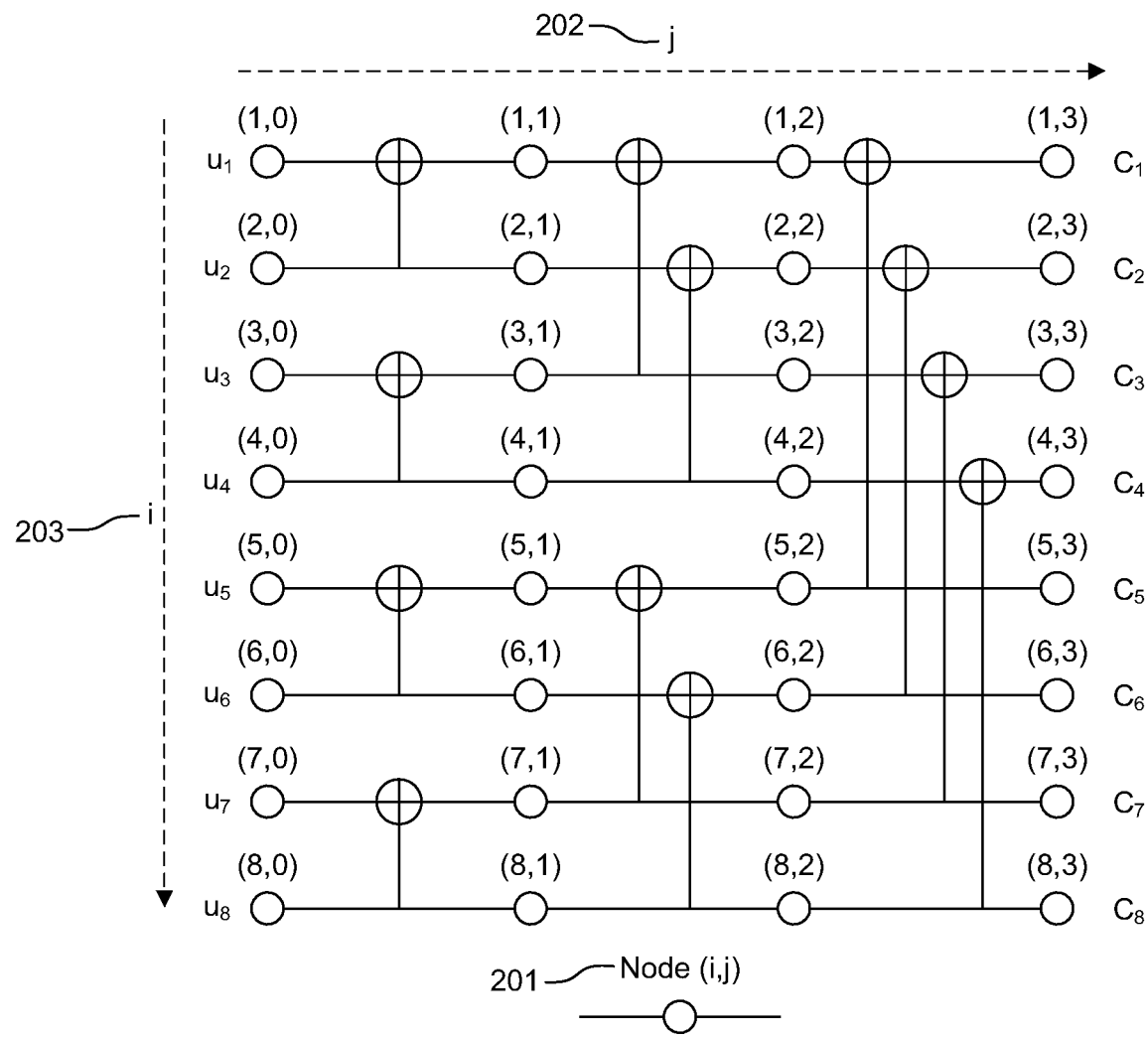
FIG. 2 is a diagram of an example polar code encoder with codeword block-length N=8.

FIG. 2 is a diagram of an example polar encoder with codeword block-length N=8. As shown, the polar encoder may be represented by the nodes 201, where the nodes may be denoted by (i,j), i=1, ..., N and j=0, ..., n. The vertical axis 202 and the horizontal axis may be denoted by (i,j), respectively.

Generally, decoding algorithms for polar codes may be categorized into two types, Successive Cancellation (SC) based decoding and Belief Propagation (BP) based decoding. SC polar decoding is a sequential decoding method to calculate Log Likelihood Ratio (LLR) value of input bits in a serial manner. SC polar decoding may be based on the assumption that the previously decoded bits are correct and they can be used for decoding the current bit. Successive Cancellation List (SCL) decoding may involve adoption of several lists of candidate paths to improve the performance of SC decoding. The best list may be selected according to the outcome of the LLR calculation. CRC Aided Successive Cancellation List (CA-SCL) decoding may adopt the embedded CRC as a tool to select the list. By CA-SCL decoding, polar codes may achieve error performance comparable or superior to conventional LDPC code or turbo code.

Bit Interleaved Coded Modulation (BICM) is one approach that may be used to combine a channel code with modulation. For instance, the output code bits of a channel encoder may be interleaved and the interleaved bits may be mapped to modulation symbols in a BICM transmitter.

Figure 3:
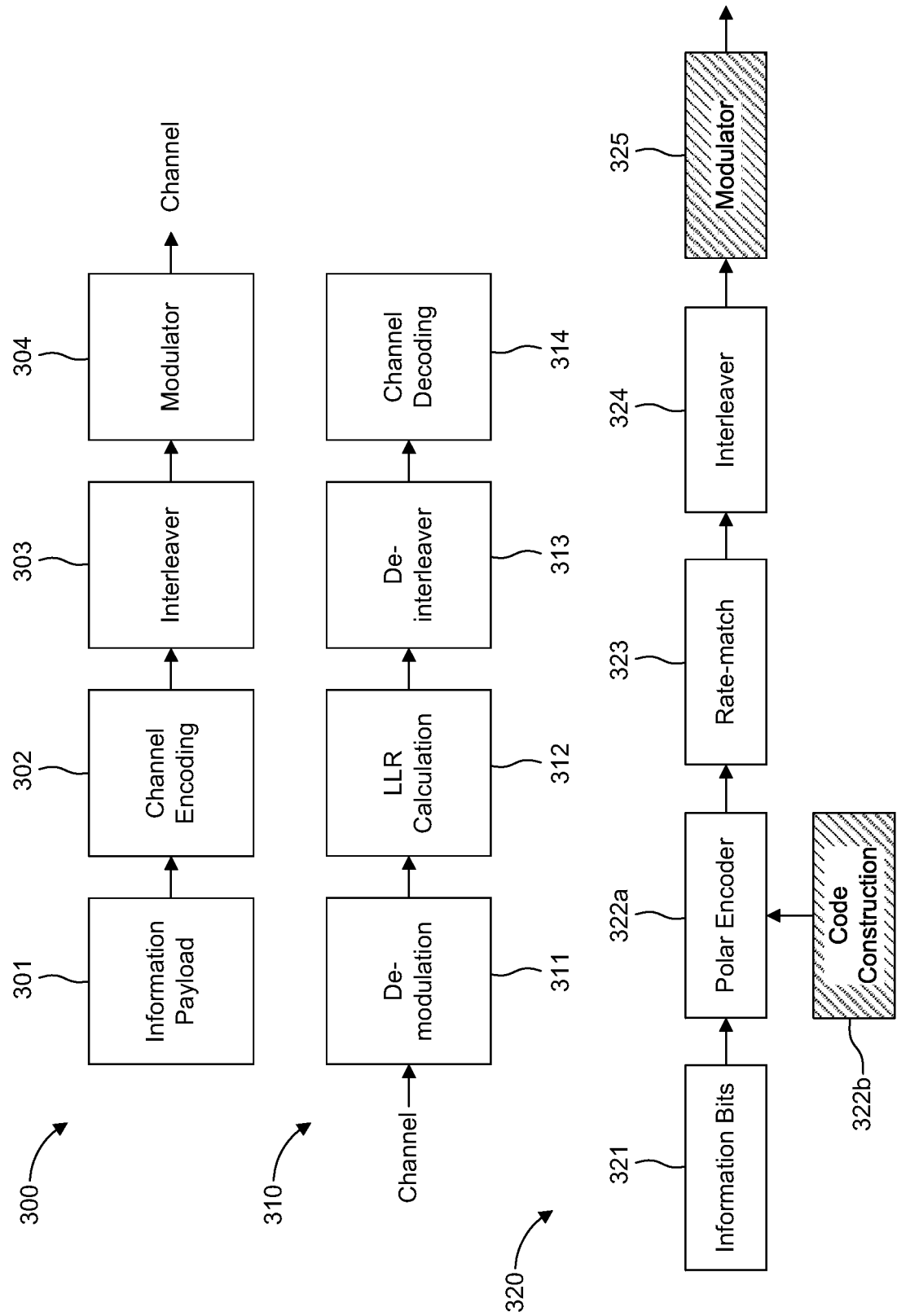
FIG. 3 is a diagram illustrating an example process of both a Bit Interleaved Coded Modulation (BICM) transmitter BICM receiver

FIG. 3 is a diagram illustrating an example process of both a BCIM transmitter BICM receiver. Generally, a BCIM transmitter process 300 may begin with receiving the information payload 301 (e.g., from the upper layers). Then channel encoding 302 (e.g., polar code encoding) may be performed on the received information payload, then the encoded bits may be interleaved then modulated. In a BICM receiver process at 310, the received channel symbols may be demodulated 311 and LLR values corresponding to each code bit calculated 312. After LLR calculation, the values may be deinterleaved 313 for channel decoding 314.

The BICM method can flexibly combine channel coding with modulation, while providing maximum diversity under fading channel to show better error performance. The Gray mapping rule may be considered an optimum mapping method for BICM. BICM may be adopted for the integration of polar codes with modulation in the uplink channel, and gray mapped QAM may further be adopted for modulation. The modulation order may be defined as $m = \log_2 M$ when M-ary QAM (or constellation) is considered. Under this assumption, for example, the modulation order of 16QAM is 4.

Polar codes may be one candidate channel coding scheme for high throughput communications. High order modulation may be a key enabler of high throughput and, therefore, higher-order modulation operation in conjunction with polar codes.

In some cases, for polar code construction, it may be assumed that each encoded bit experiences the same or very similar aggregated channel effects or conditions at the receiver. Under such an assumption, the aggregated channel effect or condition implies not only the physical channel, but the impact of multiple transmitter-receiver operations such as MIMO demultiplexing, successive-cancellation, and the like. The aggregated channel effects or conditions, simply denoted as channel conditions for convenience, for each polar code bit may include the effects by the other additional schemes (e.g., a channel interleaver or MIMO transmitter or etc.) to or modification (e.g., 16QAM or fading channel or etc.) from the basic polar code with BPSK/QPSK modulations under an Additive White Gaussian Noise (AWGN) channel.

However, similarly, when the polar codes are combined with high order modulation, this assumption of the same or very similar channel effects and/or conditions may not be preserved, and there may exist discrepancies of channel conditions among each received LLR value for each code bit. This presents a possible issue in using polar codes in some cases. In some implementations, polar codes may utilize a channel interleaver to average these discrepancies caused by high order modulation to improve the error rate performance. However, the channel interleaver may not provide sufficient uniformity of channel conditions even after the interleaving operation, which may result in a performance gap between the interleaver operation and the ideal case with uniform aggregated channel conditions. This gap may increase further with an increase in modulation order.

Accordingly, there is a need to address the issue(s) disclosed above (e.g., varying channel conditions). Specifically, as described herein, there may be one or more methods, systems, and/or devices for unequal protection (UEP) approaches using component polar codes (e.g., for a high order modulation system). UEP approaches may affect one or more processes of a transmission. For example, referring again to the example of FIG. 3, UEP approaches may introduce processes that involve the polar encoder 322a (e.g., as it relates to the code construction 322b), and the modulator 325.

Generally, a polar code system may employ BICM methods. In UEP approaches, the input bits to a polar encoder may be divided into P groups. Each P group may be contiguous in the domain of input bit index. The length of a group man be defined by the number of bits within the group. For the case where a group starts from the input index of a power of two (e.g., assuming the index numbering starts from 1), the bits within the group may correspond to the input bits of a particular component polar code. The number of unfrozen bits within each component polar code may be defined by $K_0'$, $K_1'$, . . . , $K_{P-1}'$, where $$K=K_0'+K_1'+\ldots+K_{P-1}'=\Sigma_{p=0}^{P-1}K_p' \quad \text{Equation 3}$$

There may be one or more means for determining UEP parameters. Considering that the received code bits may experience different (e.g., binary) channel conditions, UEP procedures may enhance performance when applied to component polar codes (e.g., in a scenario that also includes high order modulation).

Figure 4:
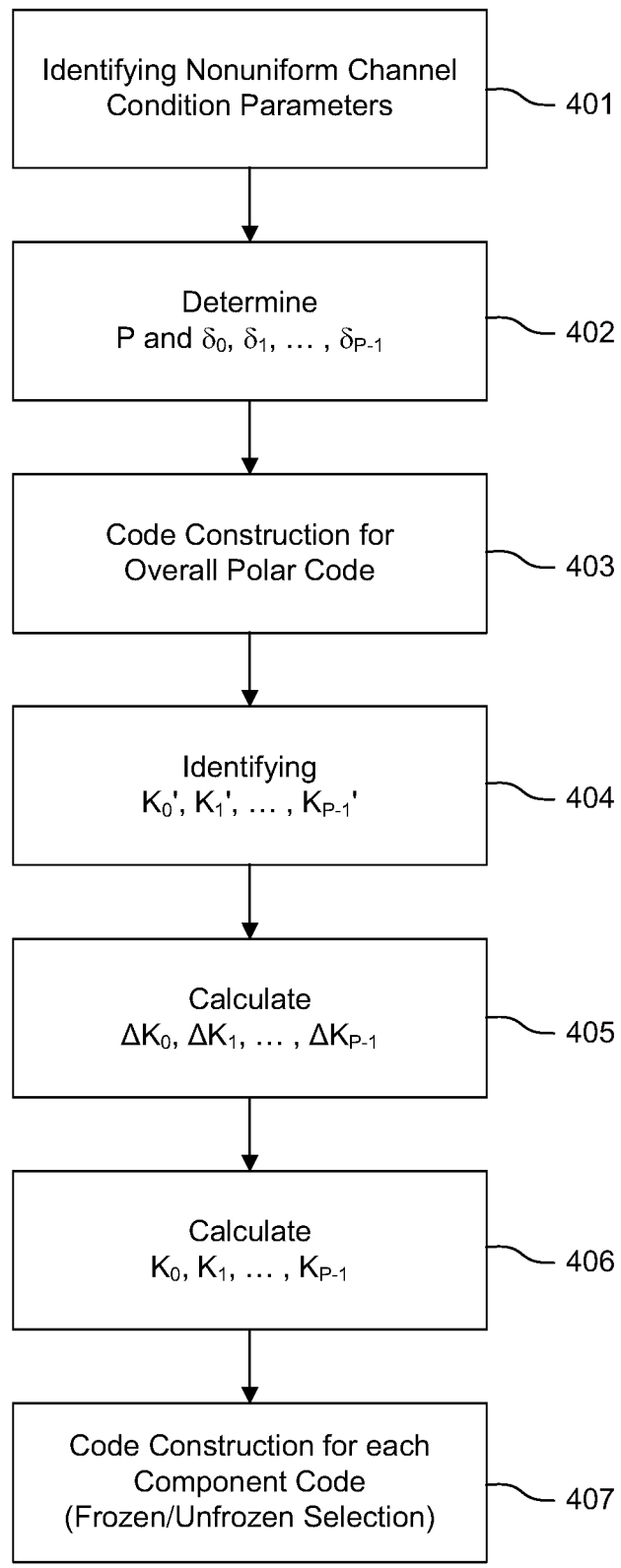
FIG. 4 is a flowchart of an example scheme for polar code construction and modulation according to one or more embodiments described herein.

FIG. 4 shows a flowchart of an example polar code scheme. At a high level, this flowchart goes through the process of code construction as it relates to the polar code scheme(s); this process is described in further detail herein. Generally, in this example the process may start at some point in the transmission process (e.g., where a transport block/information to be sent has been delivered from a higher layer to the physical layer—see FIG. 3 at 320 for example). At 401, a device may identify non-uniform channel condition parameters (e.g., modulation order, such as 16 QAM, 32 QAM, etc.). Next at 402, the number of component codes P may be determined; or said another way, how many component codes may be selected in redesigning a polar code for UEP scenario. Generally, a polar code may be a combination of different/same component codes by construction; a polar code may be considered a recursive code for purposes of this example. In some cases, delta parameters may also be determined at 402, where each delta parameters may be the ratio of frozen bits to unfrozen bits for a given component code (e.g., if starting at 0, then each component code up to P−1). At 403, the overall polar code may be constructed based on the number component codes and the delta parameters. At 404, based on overall code construction, the number of unfrozen bits before UEP for the non-uniform channel condition may be identified. At 405, the difference between the original polar code with the polar code constructed at 403 may be calculated based on the identifications made at 404. At 406, the number of unfrozen bits may be identified after UEP based on the difference determined at 405. Once this is completed, code may be constructed for each component code by selecting/changing unfrozen/frozen bits. In some cases, the process of changing the frozen/unfrozen bits may be referred to as UEP technique/process.

In one instance, the number of groups obtained from the input bits or a number of component codes, P, may be decided depending on the condition parameters (e.g., modulation order), based on a trade-off relation between complexity and performance. Note, that as discussed herein, the input bits may refer to all component codes in the polar encoder, whereas the number of component codes may refer to particular component codes. For instance, when the modulation order is larger than 2 (=QPSK), P may take a value larger than 1. In some cases, when P=1, the value may correspond to conventional polar code construction without UEP.

In another instance, it may be assumed that $\delta_0$, $\delta_1$, . . . , $\delta_{P-1}$ are the ratios of unfrozen bits to be updated for each component polar code (e.g., component code 0, component code 1, . . . , component code P−1). These ratios (a.k.a., deltas) may be determined with the number of component codes. The parameters may take negative values, which correspond to a reduction of unfrozen bits in the component code after the update, while positive values mean increasing the number of unfrozen bits. These parameters may be derived by polar code construction-based calculations, for example, density evolution or Polarization Weight (PW) based-calculations while including the modulation order in the code construction calculations, or by exhaustive simulations. From the enumerated method, the optimal code construction according to the modulation order may be derived and may be compared with the code construction derived under the assumption of equal channel conditions of each code bit. From the difference of component polar code rate between two constructions, $\delta_p$ may be derived by averaging or approximation. Note, that as a result of changing the frozen/unfrozen bits, the bit rate is also changed. Specifically, as disclosed herein, the bit rate=# of unfrozen bits/(# of unfrozen bits+# of frozen bits).

$\delta_p$ may be defined by the below equation, where $K_p'$ and $K_p$ correspond to the number of unfrozen bits in the component polar codes before UEP and after UEP, respectively.

$$\delta_p = \frac{\Delta K_p}{K_{p'}} = \frac{K_p - K_{p'}}{K_{p'}} \quad \text{Equation 4}$$

For example, P=2 for QAM with modulation order higher than 2 (QPSK) when random interleaved (e.g., or NR channel interleaver applied) may result in $\delta_0 \approx -0.0556$. The optimal code rate for each component code may be found, for example, by using equation 9, and $\delta_0$ may be derived therefrom.

Polar code construction may include a procedure to determine the input bit indices of frozen/unfrozen bits to provide to a polar encoder. One of the simplest ways to determine frozen and unfrozen bits is to use a reliability sequence.

Figure 5:
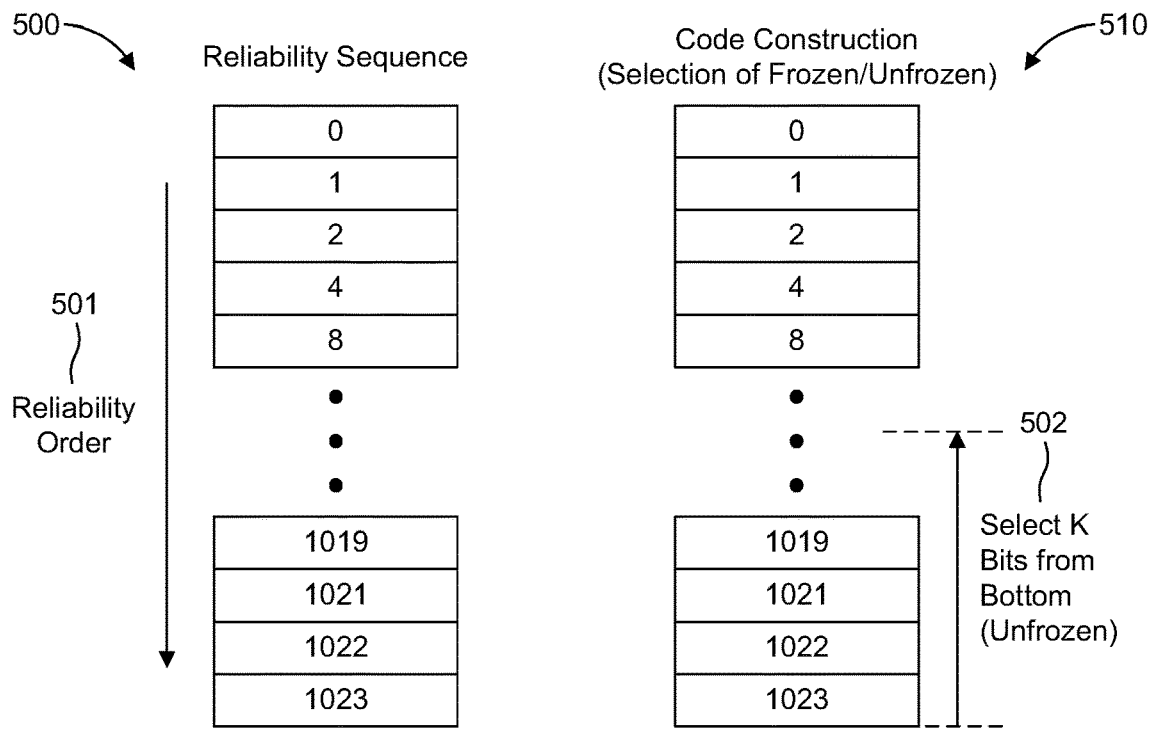
FIG. 5 is a diagram of an example of polar code construction by a reliability sequence.

FIG. 5 shows an example of polar code construction by a reliability sequence in which N=1024. As shown, the construction code sequence, which may also be referred to as the reliability sequence 500 or 510, may have integer values in the boxes that indicate input bit indices of a polar encoder and the position of the boxes indicate their relative reliability. In this example, the reliability of the input bit index may increase from the top of the list to bottom of the list (e.g., the reliability order 501). This top to bottom reliability orientation may hold true for the other example figures described herein. The bit indices given in the last K boxes 502 from the bottom may determine the unfrozen bits. The remaining input bit indices may be selected as frozen bits.

The number of unfrozen bits in the component polar codes, $K_0'$, $K_1'$, . . . , $K_{P-1}'$, may be obtained from the total polar code construction before applying the UEP process. For each input domain of each component polar code (e.g., each block of equally divided input bits by P), the number of unfrozen bits may be identified (e.g., counted).

Figure 6:
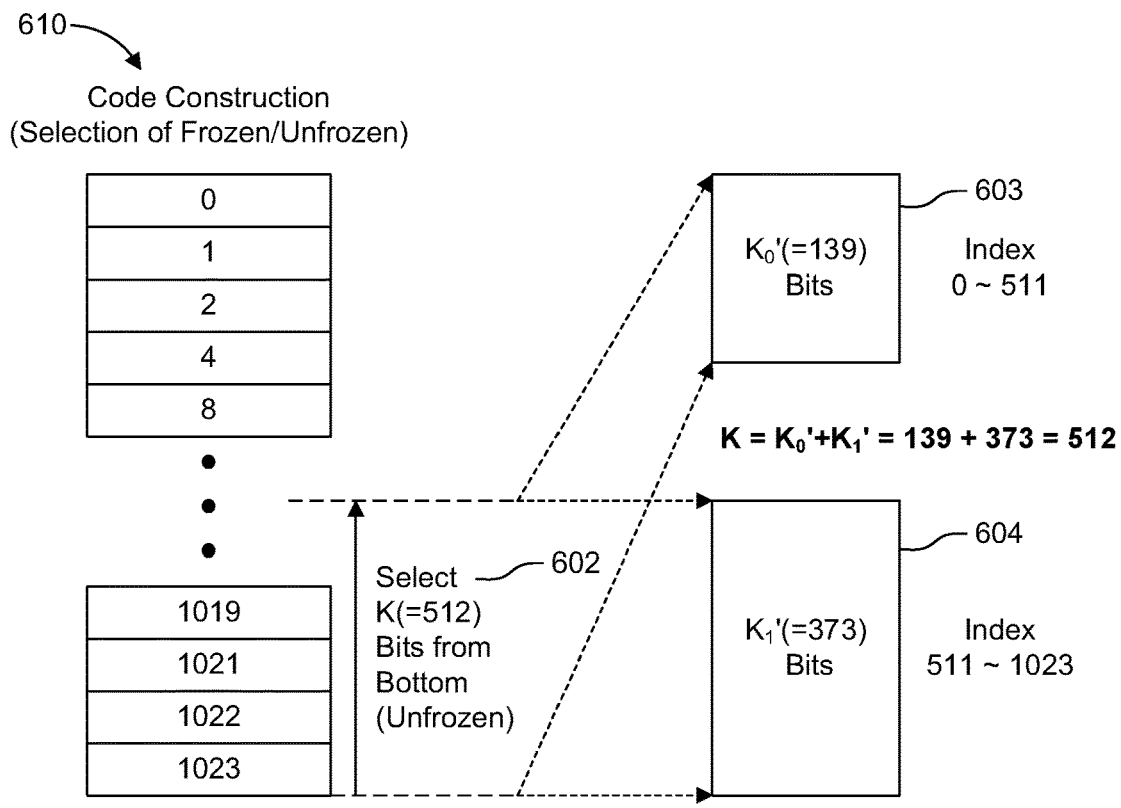
FIG. 6 is a diagram of an example of identifying the number of unfrozen bits in the component polar codes.

FIG. 6 shows an example of the polar code construction procedure when P=2, $K_0'+K_1'=K=512$ and N=1024. The code construction/reliability sequence is shown at 610, and the selection of frozen/unfrozen bits is shown at 602. In this example, there may be two groups with an equal length of $$\frac{N}{P} = 512,$$

where this represents me selection 602 of unfrozen bits from the bottom of the code construction. The range of the first group 603 may be from 0 to 511, while the range of the second group 604 may be from 512 to 1023. As shown, in the first group 603, 139 unfrozen bits may be determined and 373 unfrozen bits may be determined in the second group 604. Therefore, the code rate of the first component polar code (e.g., the first group 603) is 139/512 and the code rate of the second component polar code (e.g., second group 604) is 373/512.

As described herein, there may be one or more procedures for code construction for each component polar code. In one example, the number of unfrozen bits after applying the UEP process at each input bit group may be defined as $K_0$, $K_1$, . . . , $K_{P-1}$. By including differential unfrozen bits to $K_0'$, $K_1'$, . . . , $K_{P-1}'$ by unfrozen bits obtained from $\delta_0$, $\delta_1$, . . . , $\delta_{P-1}$ values, a modified code construction may be configured to provide unequal error protection. The number of differential unfrozen bits per each input bit group, $\Delta K_0$, $\Delta K_1$, . . . , $\Delta K_{P-1}$, may be calculated by $$\Delta K_p = [K_p' \times \delta_p], p=0,1, \ldots ,P-1$$

The number of unfrozen bits for each component polar code after the UEP process may be given by $$K_p = K_p' + \Delta K_p, p=0,1, \ldots ,P-1 \quad \text{Equation 5}$$

The number of frozen bits for each component polar code after the UEP process is, $$N_p - K_p = N_p - K_p' - \Delta K_p, p=0,1, \ldots ,P-1 \quad \text{Equation 6}$$

The overall unfrozen bits may be assumed to be also K after the UEP process and a $K_p$ value may be automatically decided by this assumption. For example, if we select p=P−1 the last component polar code, $$K_{P-1} = K - \Sigma_{p=0}^{P-2} K_p \quad \text{Equation 7}$$

In the example of FIG. 6, 8 bit indices having the least reliability among the unfrozen bits in the first group 603 (e.g., input bit index from 0 to 511) may be converted from unfrozen bits into frozen bits. Similarly, 8 bit indices having the greatest reliability among the frozen bits in the second group 604 (e.g., input bit index from 512 to 1023) may be converted into unfrozen bits. These procedures may be started from the last selected unfrozen bit index in the overall (e.g., original) polar code construction. From the last index selected in original code construction, the decision on the index value of each box in the figure may be checked if it is the first group or the second group in terms of both directions (e.g., upwards, downwards) until all differential unfrozen or frozen bits for each component code are decided.

Figure 7:
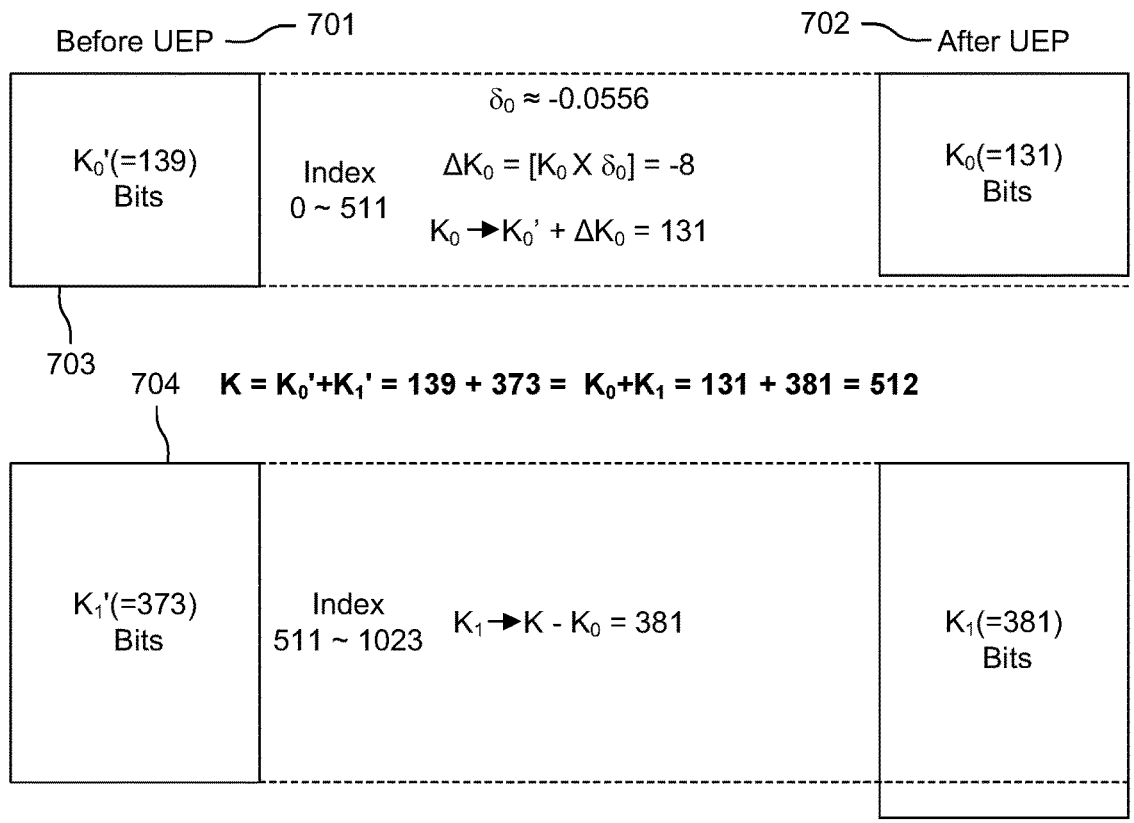
FIG. 7 is a diagram of an example of code construction for each component polar code.

FIG. 7 shows an example of code construction for each component polar code. This example may follow the same procedure as described in FIG. 4, where bits are identified before UEP 701 and after UEP 702. This example is also similar to FIG. 6, using the same values for demonstrative purposes (e.g., the first group is shown at 703, and the second group is shown at 704). In this example, P=2, $K_0'=139$, $K_1'=373$, $K_0'+K_1'=K=512$ and N=1024. For $\delta_0 \approx -0.0556$, $\Delta K_0 = [139 \times (-0.0556)] = 8$ and $K_0 = K_0' + \Delta K_0 = 131$, and $K_1 = K - K_0 = 381$.

The proposed schemes may be evaluated under conditions shown in Table 1.

TABLE 1

| Evaluation Conditions | |
|---|---|
| Parameters | Values |
| N | 1024 |
| K | 512 (including CRC) |
| Code rate | 496/1024 = 0.484 |
| CRC | 16CRC |
| Decoding scheme | CA-SCL, list size = 8 |
| Code construction | 3GPP NR polar code sequence |
| Modulation | 3GPP NR gray mapped 256QAM |
| UEP parameters | P = 2, $\delta_0$ = −0.0556 |
| Channel Interleaver | Random interleaver |
| Channel | AWGN, fast fading |
| Minimum counted error | 100 block errors |

Figure 8:
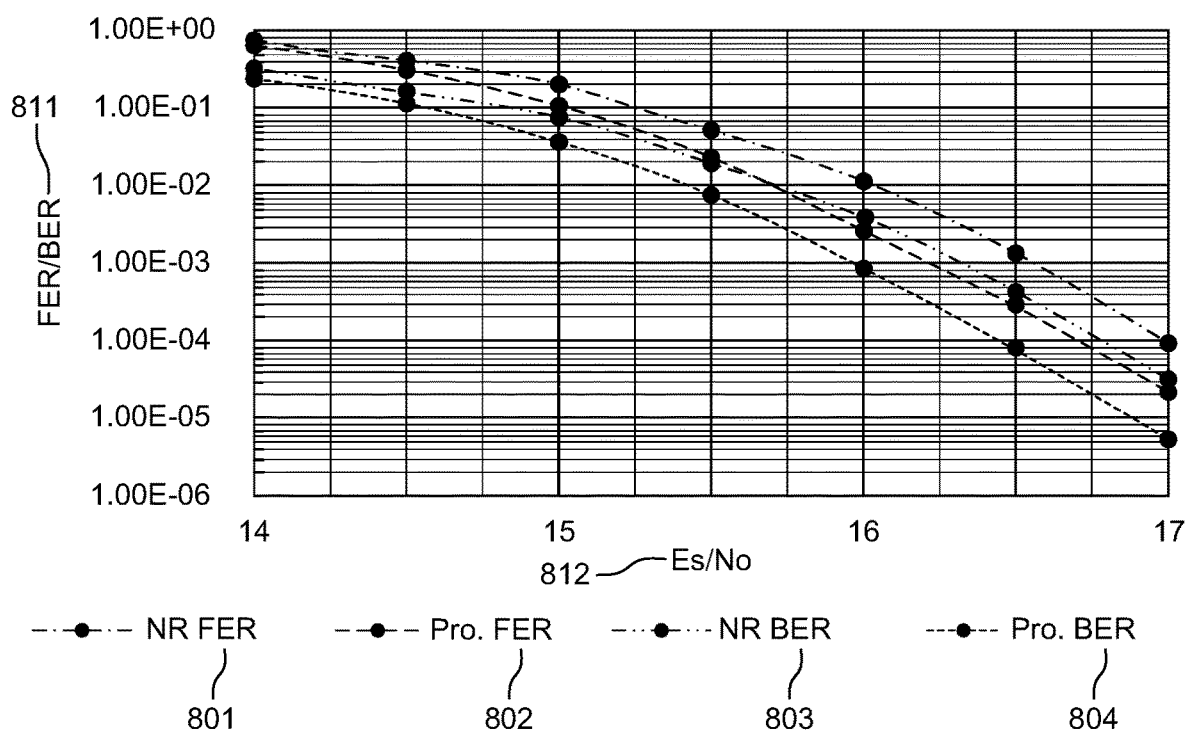
FIG. 8 is a diagram of an example comparison of frame/bit error performance in AWGN.

FIG. 8 provides an example comparison of frame/bit error performance in an Additive white Gaussian Noise (AWGN) channel for demonstrative purposes relating to the effectiveness of the techniques described herein. The Frame Error Rate (FER)/Bit Error Rate (BER) may be shown in the vertical axis 811, and the Symbol Power (ES)/Noise Power (No) Es/No may be shown in the horizontal axis 812. In this example, the proposed UEP may have coding gain of −0.3 dB at a BER/FER of $10^{-4}$.

Figures 9, 10:
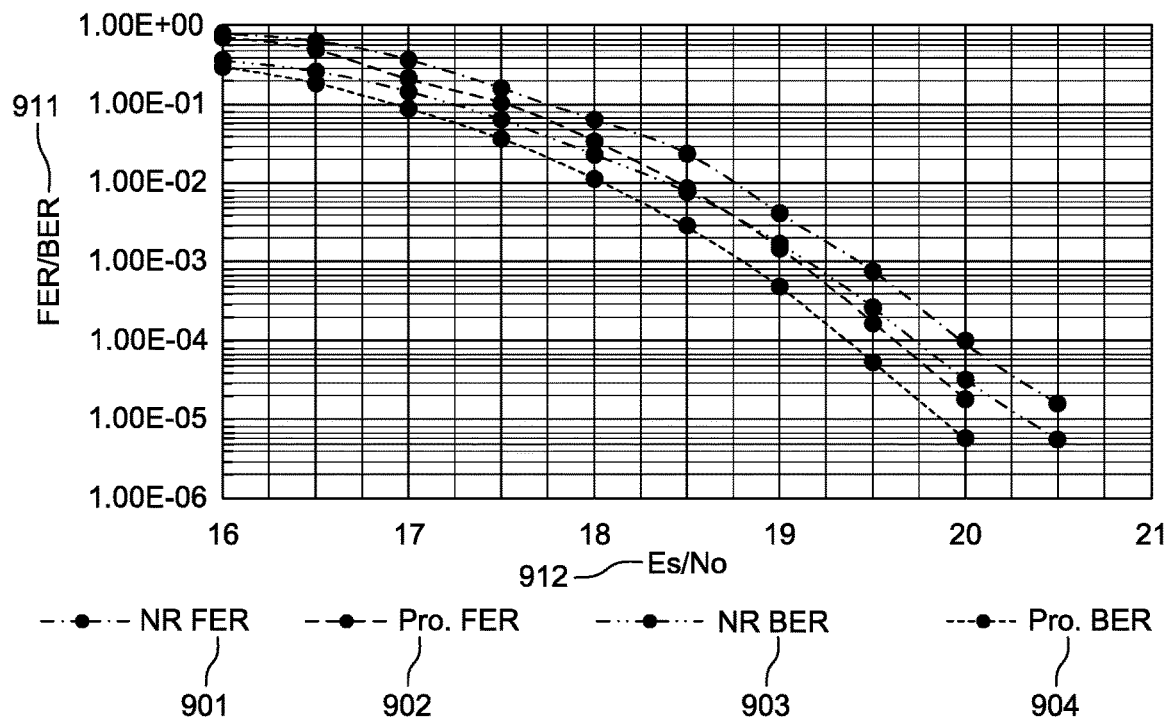
FIG. 9 is a diagram of an example comparison of frame/bit error performance in fast fading.
FIG. 10 is a diagram of an example of an original code construction sequence.

FIG. 9 provides an example comparison of frame/bit error performance in a fast fading channel for demonstrative purposes relating to the effectiveness of the techniques described herein. The FER/BER may be shown in the vertical axis 911, and the Es/No is shown in the horizontal axis 912. Here, the proposed UEP may have a coding gain of −0.5 dB at a BER/FER of $2 \times 10^{-5}$. Greater performance gains may be expected for higher order modulations such as 512QAM and 1024QAM.

In some cases, an adaptive polar code construction sequence may be configured. By introducing a different code construction sequence, the same effect as UEP may be achieved. In the event the received bits experience different aggregate channel conditions, in one option, distinct code construction sequences for each event may be used at the encoder.

As an example of aggregate channel condition change, such as when the modulation order larger than 2 (QPSK) is combined with polar code, different code construction sequences may be applied depending on the selected modulation order at the transmitter, presenting a trade-off relationship between complexity and performance. That is, a different code construction sequence for each modulation order may be assumed for purposes of illustrating this example. In a simpler example, a single code construction sequence for modulation order higher than 2 may be used.

Various methods to configure code construction sequence(s) may be employed in addition to the original code construction sequence. For instance, a code construction sequence may be generated by offline calculation. Depending on the channel conditions, an offline calculation optimized for the corresponding channel conditions may be performed. In this case, and when k different code constructions are assumed, a total size of kN sequences may be needed to be saved in the memory.

One offline calculation method is Polarization Weight (PW)-based code construction sequence generation. In this method, the reliability of each input index under uniform channel condition for each polar code bit may be calculated by $$\theta(j) = \Sigma_{s=0}^{n-1} j_s \times 2^{\rho(n-1-s)}$$ Equation 8

Here, $\theta(j)$ may denote a reliability value of the j-th input bit index. $j_s$ denotes the s-th binary digit value when j is expressed in binary digit form. From the formula provided, reliability values of all bit indices may be obtained, and a code construction sequence based on these reliability values may also be created by sorting the values of $\theta(j)$, $j=0, 1, \ldots, N-1$.

In one option, the reliability value calculation formula given in Equation 8 may be modified to generate code construction sequence for different modulation orders. For example:

$$\theta_{new}(i) = \Sigma_{s=0}^{n-1-a} j_s \times 2^{\rho(n-1-s)} + \Sigma_{i=0}^{a-1} j_{n-1-l} \times 2^{\alpha(l)(n-1-l)}$$ Equation 9

Using the modified formula, large a and corresponding $\alpha(l)$ coefficients may be used to design more sophisticated code construction sequences. A simple example may be to select a=1 and $\alpha(0)=0.255$ for all QAM modulation order higher than 2 (QPSK). By sorting $\theta_{new}(j)$, a new code construction sequence for higher order modulation can be acquired.

In some cases, a new code sequence may be generated by modifying an original code construction sequence. This may be advantageous, for example, if saving a new sequence requires additional memory. In such a case, modifying the original code construction may result in a more relaxed memory requirement comparatively to generating a new sequence.

FIG. 10 shows an example of an original code construction sequence modified according to one method described herein. In this example, an offset may be assigned to the reliability value for each component polar code. For purposes of illustration, the reliability offset may be added to the code construction sequence shown in FIG. 10 for an example of N=16.

In this example, each table 1010 and 1020 has a left column of reliability (1011, 1021) and a right column of input index (1012, 1022). For instance, the input bit index 10 has 9th reliability order. The selection of the second component code is shown in 1020 by grey shading. For each component polar code or each group, an offset, $o_p$, (p=0, 1, \ldots, P-1) may be imposed to generate a new code construction sequence for adaptive code construction. For example, $o_0=0$ and $o_1=5$ can be imposed 1010 and 1020.

FIG. 11 shows an example process of generating a new code construction by offset. At 1110 and 1120 there are additions of offsets to input bit indices of the second component code (e.g., the second group) and 1130 shows a final new code construction sequence after sorting. Just as in FIG. 10, the selection of the second component code is shown by grey shading, and each listing may have a right column showing reliability (1111, 1121, 1131) and a left column for input index (1112, 1122, 1132). The new code construction sequence may have a different reliability order from the original sequence to have higher reliability for the second component polar code. When another code construction is required, another offset value may be used, and similarly multiple code construction sequences may be acquired. For a new code construction sequence, the frozen and unfrozen bit indices may be selected (e.g., using one or more techniques described herein) as shown by the grey shading. For instance, the most reliable K bits may be selected as unfrozen bits and the remaining bits may be selected as frozen bits.

The code construction sequence described herein may denote reliability order by an ordered integer sequence with an incremental value of one (e.g., 0, 1, \ldots, N-1), which may not demonstrate relative reliability values of each input index. Therefore, when a new sequence is generated based on an offset, the reliability order of the new sequence may not simply correspond to the offset version of the original reliability order by the same value. To overcome this, the reliability of each input bit index may be described in higher precision to have a more accurate generation of a new sequence.

Figure 12:
FIG. 12 is a diagram of an example of code construction sequence in higher precision.

FIG. 12 shows an example in which the reliability of input bit indexes are described in higher precision. By imposing offsets (e.g., FIG. 11) based on high precision reliability order, the new code construction sequence may be generated without distortion induced by simple incremental value of one (e.g., as shown, the reliability 1201 is not incremented by one). In some cases, the basis for the increments may be the offset value; depending on the offset value, the increments may be any value. In this case, the offset values may have higher precision than the previous example. The higher precision may be acquired by quantizing values of probability in results of probability calculation (e.g., code construction by density evolution) or polarization weight.

Generally, any techniques disclosed herein with respect to polar encoding may also be applicable to a reciprocal decoding process.

Once the modified code construction parameters are determined based on the incremental ratios, the corresponding component codes have a new code construction sequence, hence some of the frozen bits may be converted to unfrozen bits or vice versa according to these new parameters. With the new code construction sequence, the component codes proceed with standard polar encoding procedure in order to obtain the encoded bits.

In one case, a device may perform a process for channel coding using polar codes. The device may identify a non-uniform channel condition parameter. The device may determine a plurality of component codes and a plurality of incremental ratios for component code for Unequal Error Protection (UEP) based on the non-uniform channel condition parameter, wherein the component codes may include a plurality of input bits. The device may determine initial code construction parameters based on a uniform condition for the plurality of component codes, wherein the initial code construction parameters may include an initial number of unfrozen input bits or an initial number of frozen input bits. The device may then determine modified code construction parameters based on the incremental ratios or the plurality of component codes, wherein the modified code construction parameters include a modified number of unfrozen input bits and a modified number of frozen input bits. The device may then encode a plurality of information bits for a transmission to be transmitted under non-uniform channel conditions using the plurality of component codes according to the modified code construction parameters. This encoding may occur in the encoder. The disclosed operations in the encoder may result in modifications to the order of the encoded bit streams, which may be identified by comparing such bit stream produced by other encoding methods. Moreover, the details of the operations employed for code construction may be determined by investigating various test input (uncoded) bit streams and their corresponding encoded bit stream outcomes. Once encoded, the device may send the transmission. In some cases, the non-uniform channel condition is a modulation order, and/or the modulation order may be based on the non-uniform channel condition. In some cases initial code construction parameters may be prior to UEP. In some cases the modified code constructions parameters may be after UEP. In some cases, the modified code construction parameters may further include a reliability sequence. In some cases, determining the initial code construction parameters may include calculating and comparing reliability values for each input bit in a component code. In some cases, calculating and comparing reliability values for each input bit in a component code may be performed according to a Polarization Weight-based method. In some cases, calculating and comparing reliability values for each input bit in a component code may be performed by further assigning an offset to each reliability value. In some cases the device may be a wireless transmit receive unit (WTRU), a base station, a new radio network node, a network function entity, an access point, a station, an eNodeB, or a gNodeB.

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs). A processor in association with software may be used to implement a radio frequency transceiver for use in a WTRU, UE, terminal, base station, RNC, or any host computer.

What is claimed:

1. A method implemented by a device for channel coding, the method comprising:
    selecting a modulation order based on a non-uniform channel condition;
    determining modified code construction parameters for a plurality of component codes based on the selected modulation order, wherein the modified code construction parameters include a modified number of unfrozen input bits and a modified number of frozen input bits;
    encoding a plurality of information bits for a transmission to be transmitted using the selected modulation order and using the plurality of component codes according to the modified code construction parameters; and
    sending the transmission with the plurality of encoded information bits.

2. The method of claim 1, wherein the modified code construction parameters are further based on initial code construction parameters, wherein the initial code construction parameters are determined for the plurality of component codes based on a uniform channel condition for the plurality of component codes, wherein the initial code construction parameters include an initial number of unfrozen input bits or and an initial number of frozen input bits, and wherein the uniform channel conditions are different than the non-uniform channel conditions.

3. The method of claim 1, wherein the non-uniform channel condition is determined from a channel that experiences varying conditions at a transceiver of the device.

4. The method of claim 2, wherein the uniform channel condition is determined from a channel that experiences same or similar conditions at a transceiver of the device.

5. The method of claim 3, wherein a set of modified code constructions parameters are determined for each non-uniform channel condition of a plurality of non-uniform channel conditions.

6. The method of claim 1, wherein modified code construction parameters further include a reliability sequence.

7. The method of claim 2, wherein each component code of the plurality of component codes includes a plurality of input bits, wherein determining the initial code construction parameters includes calculating and comparing reliability values for each input bit of the plurality of input bits in a component code.

8. The method of claim 7, wherein calculating and comparing reliability values for each input bit of the plurality of input bits in a component code is performed according to a Polarization Weight-based method.

9. The method of claim 7, wherein calculating and comparing reliability values for each input bit of the plurality of input bits in a component code is performed by further assigning an offset to each reliability value.

10. The method of claim 1, wherein the device is a wireless transmit receive unit (WTRU), a base station, a new radio network node, a network function entity, an access point, a station, an eNodeB, or a gNodeB.

11. A device, the device comprising:
    a processor operatively connected to a transceiver, the processor and transceiver configured to select a modulation order based on a non-uniform channel condition;
    the processor and transceiver configured to determine modified code construction parameters for a plurality of component codes based on a selection of a modulation order, wherein the modified code construction parameters include a modified number of unfrozen input bits and a modified number of frozen input bits;
    the processor and transceiver configured to encode a plurality of information bits for a transmission to be transmitted using the selected modulation order and using the plurality of component codes according to the modified code construction parameters; and
    the processor and transceiver configured to send the transmission with the plurality of encoded information bits.

12. The device of claim 11, wherein the modified code construction parameters are further based on initial code construction parameters, wherein the initial code construction parameters are determined for the plurality of component codes based on a uniform channel condition for the plurality of component codes, wherein the initial code construction parameters include an initial number of unfrozen input bits or and an initial number of frozen input bits, wherein the uniform channel condition means a channel upon which the transmission is to be sent experiences the same or similar conditions at a transceiver of the device, and wherein the uniform channel conditions are different than the non-uniform channel conditions.

13. The device of claim 11 wherein the non-uniform channel condition is determined from a channel that experiences varying conditions at a transceiver of the device, and a set of modified code constructions parameters are determined for each non-uniform channel condition of a plurality of non-uniform channel conditions.

14. The device of claim 11, wherein the device is a wireless transmit receive unit (WTRU), a base station, a new radio network node, a network function entity, an access point, a station, an eNodeB, or a gNodeB.

15. The device of claim 13, wherein a set of modified code constructions parameters are determined for each non-uniform channel condition of a plurality of non-uniform channel conditions.

16. The device of claim 11, wherein modified code construction parameters further include a reliability sequence.

17. The device of claim 11, wherein each component code of the plurality of component codes includes a plurality of input bits, wherein determining the initial code construction parameters includes calculating and comparing reliability values for each input bit of the plurality of input bits in a component code.

18. The device of claim 17, wherein calculating and comparing reliability values for each input bit of the plurality of input bits in a component code is performed according to a Polarization Weight-based method.

19. The device of claim 17, wherein calculating and comparing reliability values for each input bit of the plurality of input bits in a component code is performed by further assigning an offset to each reliability value.

* * * * *